US012764990B2

(12) United States Patent
Kobayashi et al.

(10) Patent No.: US 12,764,990 B2
(45) Date of Patent: Oct. 13, 2026

(54) SEMICONDUCTOR DEVICE AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hitoshi Kobayashi, Yamato Kanagawa (JP); Masaaki Onomura, Tokyo (JP); Toru Sugiyama, Tokyo (JP); Akira Yoshioka, Yokohama Kanagawa (JP); Hung Hung, Kawasaki Kanagawa (JP); Hideki Sekiguchi, Yokohama Kanagawa (JP); Tetsuya Ohno, Yokohama Kanagawa (JP); Yasuhiro Isobe, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 724 days.

(21) Appl. No.: 18/176,987

(22) Filed: Mar. 1, 2023

(65) Prior Publication Data

US 2024/0105826 A1 Mar. 28, 2024

(30) Foreign Application Priority Data

Sep. 22, 2022 (JP) ................................ 2022-151653

(51) Int. Cl.

| | |
|---|---|
| ***H10D 30/47*** | (2025.01) |
| ***H10D 30/01*** | (2025.01) |
| ***H10D 62/85*** | (2025.01) |
| ***H10D 64/00*** | (2025.01) |

(52) U.S. Cl.

CPC ......... *H10D 30/475* (2025.01); *H10D 30/015* (2025.01); *H10D 62/8503* (2025.01); *H10D 64/112* (2025.01)

(58) Field of Classification Search

None

See application file for complete search history.

(56) References Cited

U.S. PATENT DOCUMENTS

| | | | |
|---|---|---|---|
| 8,963,203 | B2 | 2/2015 | Kuraguchi et al. |
| 9,484,421 | B2 | 11/2016 | Kajiwara et al. |

(Continued)

FOREIGN PATENT DOCUMENTS

| | | | |
|---|---|---|---|
| JP | 5662367 | B2 | 1/2015 |
| JP | 2016-062935 | A | 4/2016 |

(Continued)

*Primary Examiner* — Khaja Ahmad

(74) *Attorney, Agent, or Firm* — Kim & Stewart LLP

(57) ABSTRACT

A semiconductor device of an embodiment includes a semiconductor layer, a first insulating film provided on the semiconductor layer, a first electrode film provided on the first insulating film, a second electrode film provided on the first electrode film, and a first field plate electrode provided on the second electrode film. A lower end of the first field plate electrode is located on a second surface of the first electrode film, the second surface being in contact with the second electrode film, rather than a first surface of the first electrode film, the first surface being in contact with the first insulating film.

18 Claims, 15 Drawing Sheets

(56) References Cited

U.S. PATENT DOCUMENTS

| | | | | |
|---|---|---|---|---|
| 2014/0092636 | A1* | 4/2014 | Kanamura | H02M 3/28 438/573 |
| 2016/0079382 | A1 | 3/2016 | Ogawa et al. | |
| 2016/0079407 | A1* | 3/2016 | Aoyama | H01L 21/28264 257/194 |
| 2016/0111502 | A1 | 4/2016 | Hagleitner | |
| 2016/0268380 | A1 | 9/2016 | Furukawa | |

FOREIGN PATENT DOCUMENTS

| | | | |
|---|---|---|---|
| JP | 2016-062982 | A | 4/2016 |
| JP | 2016-171265 | A | 9/2016 |
| JP | 6487021 | B2 | 3/2019 |

* cited by examiner

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2022-151653, filed on Sep. 22, 2022, the entire contents of which are incorporated herein by reference.

FIELD

Embodiments described herein relate generally to a semiconductor device and method for manufacturing a semiconductor device.

BACKGROUND

Semiconductor devices such as a transistor and a diode are used for circuits such as a switching power supply circuit and an inverter circuit. These semiconductor devices are required to have a high withstand voltage and a low on-resistance. In order to prevent electric field concentration, a field plate electrode may be used for a semiconductor device.

DETAILED DESCRIPTION

Figure 1:
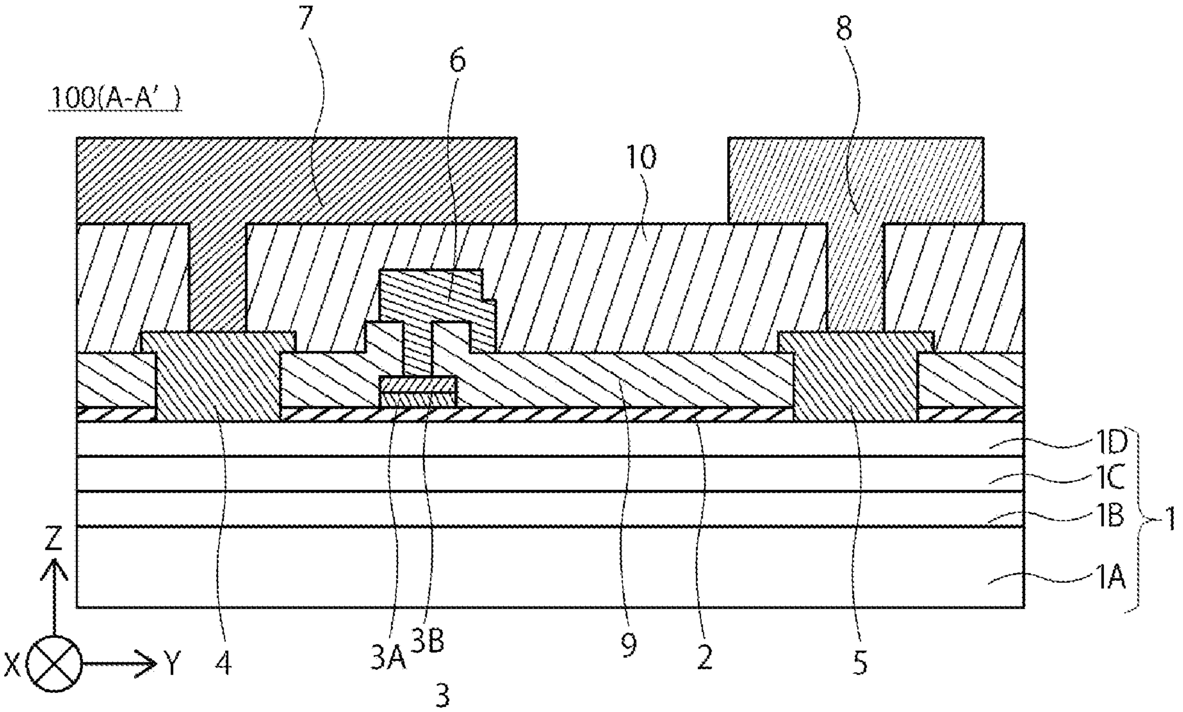
FIG. 1 is a schematic cross-sectional diagram of a semiconductor device according to an embodiment.

A semiconductor device of an embodiment includes a semiconductor layer, a first insulating film provided on the semiconductor layer, a first electrode film provided on the first insulating film, a second electrode film provided on the first electrode film, and a first field plate electrode provided on the second electrode film. A lower end of the first field plate electrode is located on a second surface of the first electrode film, the second surface being in contact with the second electrode film, rather than a first surface of the first electrode film, the first surface being in contact with the first insulating film.

Hereinafter, embodiments will be described with reference to the drawings. In the following description, the same or similar members are denoted by the same reference numerals, and the description of the members described once may be omitted.

In the present specification, a "nitride semiconductor layer" includes a "GaN-based semiconductor". The "GaN-based semiconductor" is a generic term for a semiconductor including gallium nitride (GaN), aluminum nitride (AlN), indium nitride (InN), and an intermediate composition thereof.

In the present specification, "undoped" means that an impurity concentration is $2\times10^{16}$ $cm^{-3}$ or less.

In the present specification, in order to indicate a positional relationship of components, and the like, an upward direction in the drawings is described as "upper", and a downward direction in the drawings is described as "lower". In the present specification, the concepts of the "upper" and the "lower" are not necessarily terms indicating a relationship with a direction of gravity.

Physical properties in the specification are values in an air atmosphere at 25° C.

First Embodiment

A first embodiment relates to a semiconductor device and a method for manufacturing a semiconductor device. A semiconductor device according to a first embodiment includes a semiconductor element having a semiconductor layer, and a wiring layer on the semiconductor element. Hereinafter, an example of a GaN-based semiconductor device will be described, but the semiconductor element may be a lateral transistor other than the GaN-based transistor.

Figure 2:
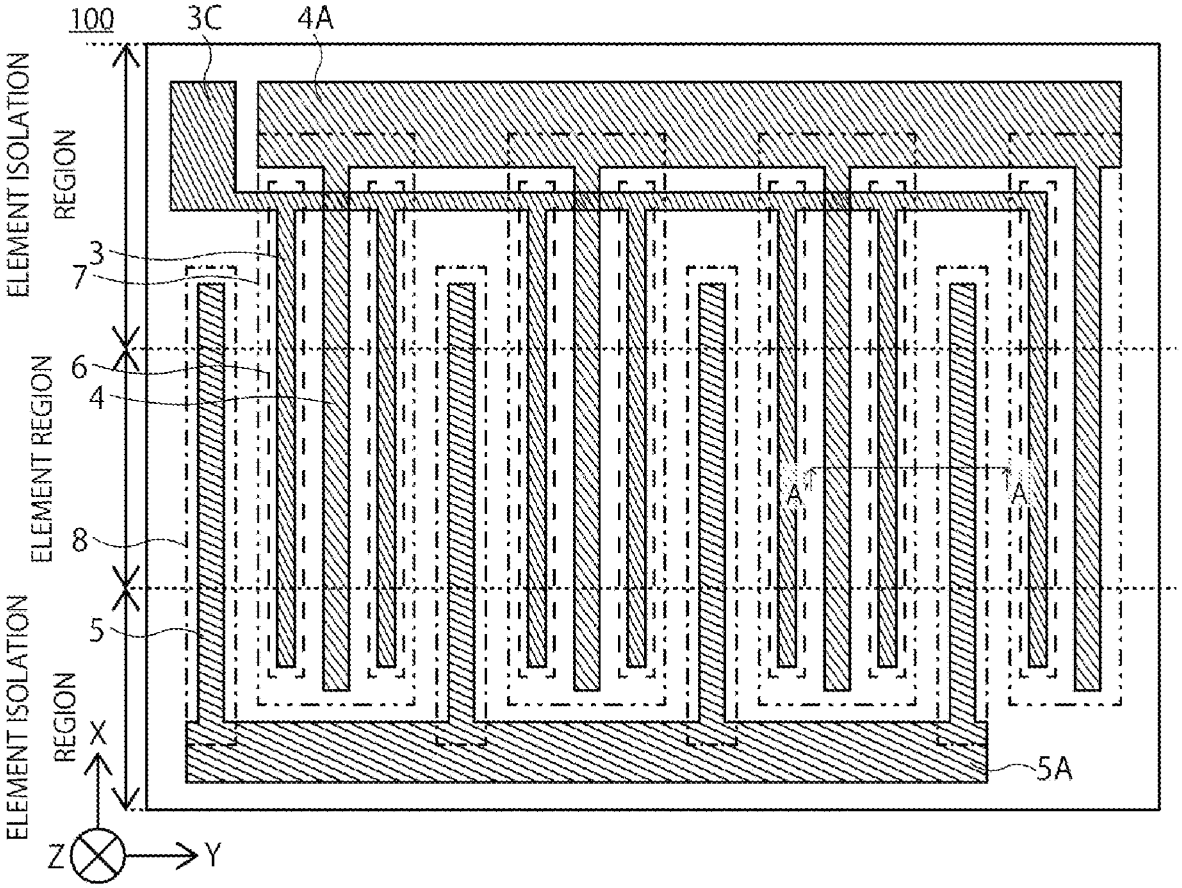
FIG. 2 is a schematic top-view diagram of a semiconductor device according to an embodiment.

FIG. 1 is a schematic diagram of a semiconductor device 100 according to the first embodiment. FIG. 2 is a schematic top-view diagram of the semiconductor device 100 of the first embodiment. FIG. 2 is a schematic cross-sectional diagram taken along line A-A' of FIG. 1. The semiconductor device 100 is, for example, a high electron mobility transistor (HEMT) using the GaN-based semiconductor. The semiconductor device 100 includes an element region that operates as a transistor and a non-element region that does not operate as a transistor.

The semiconductor device 100 of FIG. 1 includes a semiconductor layer 1, a first insulation film 2, a first electrode 3, a second electrode 4, a third electrode 5, a first field plate electrode 6, a second field plate electrode 7, a third field plate electrode 8, a second insulation film 9, and a third insulation film 10.

For example, the semiconductor layer 1 is formed by stacking a substrate 1A, a buffer layer 1B, a channel layer 1C (first nitride semiconductor layer), and a barrier layer 1D (second nitride semiconductor layer) in this order. The semiconductor layer 1 includes the element region and the element isolation region. The element isolation region is provided from a surface of the barrier layer 1D of the semiconductor layer 1. A region in which the channel layer 1C of the semiconductor layer 1 and the element isolation region of the barrier layer 1D are not provided is an element region. The element region is sandwiched, for example, the element isolation regions.

The substrate 1A is formed of, for example, silicon (Si). In addition to the silicon, for example, sapphire ($Al_2O_3$) or silicon carbide (SiC) can be applied.

The buffer layer 1B is provided on the substrate 1A. The buffer layer 1B has a function of reducing lattice mismatch between the substrate 1A and the channel layer 1C. The buffer layer 1B is formed in a multilayer structure of, for example, aluminum gallium nitride ($Al_WGa_{1-W}N$ ($0<W\leq 1$)).

The channel layer 1C is provided on the buffer layer 1B. The channel layer 1C is also referred to as an electron transit layer. The channel layer 1C is, for example, undoped aluminum gallium nitride ($Al_XGa_{1-X}N$ ($0\leq X<1$)). More specifically, the channel layer 1C is, for example, undoped gallium nitride (GaN). A thickness of the channel layer 1C is, for example, 0.1 μm or greater and 10 μm or less. In the embodiment, the thickness is a length (height) of each member in a third direction (Z direction) that is a stacking direction of the channel layer 1C and the barrier layer 1D, the length including the channel layer 1C.

The channel layer 1C is provided on the buffer layer 1B. The channel layer 1C is also referred to as an electron transit layer. The channel layer 1C is, for example, undoped aluminum gallium nitride ($Al_XGa_{1-X}N$ ($0\leq X<1$)). More specifically, the channel layer 1C is, for example, undoped gallium nitride (GaN). A thickness of the channel layer 1C is, for example, 0.1 [μm] or greater and 10 [μm] or less. In the embodiment, the thickness is a length (height) of each member in a third direction (Z direction) that is a stacking direction of the channel layer 1C and the barrier layer 1D, the length including the channel layer 1C.

The barrier layer 1D is provided on the channel layer 1C. The barrier layer 1D is also referred to as an electron supply layer. A band gap of the barrier layer 1D is larger than a band gap of the channel layer 1C. The barrier layer 1D is, for example, undoped aluminum gallium nitride ($Al_YGa_{1-Y}N$ ($0<Y\leq 1$, $X<Y$)). More specifically, the barrier layer 1D is, for example, undoped $Al_{0.25}Ga_{0.75}N$. A thickness of the barrier layer 1D is, for example, 2 [nm] or greater and 100 [nm] or less.

A heterojunction interface is formed between the channel layer 1C and the barrier layer 1D. A two-dimensional electron gas (2DEG) is formed at the heterojunction interface and becomes a carrier of the semiconductor device 100.

The element isolation region is a high resistance region formed by ion implantation. The element isolation region is formed, for example, at least to the inside of the channel layer 1C. As ion species for separating elements, for example, nitrogen, argon, or the like can be applied. The dose amount associated with ion implantation is, for example, about $1\times 10^{14}$ (ions/$cm^2$). Acceleration energy for performing ion implantation is, for example, about 100 keV or greater and 200 keV or less. A region in which the element isolation region 12 is formed (boundary between the element isolation region 12 and the element region) can be confirmed by cross-section observation using a transmission electron microscope (TEM) or the like.

A gate insulation film (Hereinafter the first insulation film s will be referred as the gate insulation film s) may be provided between the first electrode 3 and the barrier layer 1D, and the semiconductor device 100 may be a metal insulator semiconductor (MIS) type HEMT. The gate insulation film 2 is provided between the second electrode 4 and the third electrode 5. The gate insulation film 2 is formed of, for example, an oxide or an oxynitride. The gate insulation film 2 is formed of, for example, silicon oxide ($SiO_2$), silicon nitride (SiN), aluminum oxide, silicon oxynitride, or aluminum oxynitride. The gate insulation film 2 is a dense insulation film. The gate insulation film 2 is an insulation film denser than the second insulation films 11. A thickness of the gate insulation film 2 is preferably 10 [nm] or greater and 300 [nm] or less, more preferably 100 [nm] or greater and 100 [nm] or less, and still more preferably 100 [nm] or greater and 200 [nm] or less.

The first electrode (gate electrode) 3 is an electrode having a plurality of fingers extending in a first direction (X direction). Comb-shaped fingers of the gate electrode 3 extend in the first direction, and the fingers are arranged in a second direction (Y direction). The gate electrode 3 is an electrode provided on the first insulation film 2 provided on the channel layer 1C and the barrier layer 1D. The gate electrode 3 is electrically connected to the channel layer 1C and the barrier layer 1D. For example, the gate electrode 3 is in direct contact with an upper surface of the first insulation film 2. The gate electrode 3 is provided between the second electrode 4 and the third electrode 5. The gate electrode 3 or the first field plate electrode 6 is connected to the first electrode pad (gate electrode pad) 3A. When the first field plate electrode 6 is connected to the first electrode pad 3A, for example, the gate electrode 3 has a shape of only a finger portion.

The first direction intersects the second direction and the third direction. The second direction intersects the first direction and the third direction (Z direction). Preferably, the first direction is orthogonal to a plane formed by the second direction and the third direction, the second direction is orthogonal to a plane formed by the first direction and the third direction, and the third direction is orthogonal to a plane formed by the first direction and the second direction.

The gate electrode 3 includes a first electrode film (first gate electrode film) 3A and a second electrode film (second gate electrode film) 3B. The first gate electrode film 3A and the second gate electrode film 3B are preferably stacked. It is preferable that the semiconductor layer 1, the gate insulating film 2, the first gate electrode film 3A, and the second gate electrode film 3B are sequentially stacked in the third direction.

The surface of the first gate electrode film 3A facing the side of the semiconductor layer 1 faces the gate insulating film 2. The surface of the first gate electrode film 3A facing the gate insulating film 2 is preferably in direct contact with the gate insulating film 2. The entire surface of the first gate electrode film 3A facing the gate insulating film 2 is preferably in direct contact with the gate insulating film 2. The first gate electrode film 3A suppresses diffusion of metal (specifically, Al) into the gate insulating film 2.

The surface of the first gate electrode film 3A facing the side of the second gate electrode film 3B faces the second gate electrode film 3B. The surface of the first gate electrode film 3A facing the second gate electrode film 3B is preferably in direct contact with the second gate electrode film 3B. The entire surface of the first gate electrode film 3A facing the second gate electrode film 3B is preferably in direct contact with the surface of the second gate electrode film 3B facing the side of the semiconductor layer 1. The entire surface of the first gate electrode film 3A facing the second gate electrode film 3B is preferably in direct contact with the entire surface of the second gate electrode film 3B facing the side of the semiconductor layer 1.

The surface of the second gate electrode film 3B facing the side of the first gate electrode film 3A faces the first gate electrode film 3A. The surface of the second gate electrode film 3B facing the first gate electrode film 3A is preferably in direct contact with the first gate electrode film 3A. It is preferable that the entire surface of the second gate electrode film 3B facing the first gate electrode film 3A is in contact with the surface of the first gate electrode film 3A facing the side of the first field plate electrode 6 and is in direct contact therewith. The entire surface of the second gate electrode film 3B facing the first gate electrode film 3A is preferably in direct contact with the entire surface of the first gate electrode film 3A facing the side of the first field plate electrode 6.

The first gate electrode film 3A is a single-layer or multi-layer conductive film. The first gate electrode film 3A contains a metal nitride and/or an alloy. The first gate electrode film 3A preferably contains M1AlN (nitride containing M1 element and aluminum) and/or M2AlW (alloy containing M2 element, aluminum, and tungsten). The first gate electrode film 3A preferably contains M1AlN or M2AlW. M1 is one or more kinds selected from the group consisting of Ti, W, Ta, Nb, V, and Zr. M1 preferably contains Ti, and is more preferably Ti. M2 is one or more kinds selected from the group consisting of Ti, Zr, and C. The first gate electrode film 3A preferably includes a region not containing Al. The region not containing Al of the first gate electrode film 3A is preferably M1N and/or M2W, and is preferably M1N or M2W. M2 preferably contains Ti, and is more preferably Ti.

The first gate electrode film 3A contains, for example, one or more kinds selected from the group consisting of TiAlN, WAlN, and TaAlN, and preferably contains one kind selected from the group consisting of AlTiN, WAlN, and TaAlN. Al contained in the first gate electrode film 3A is preferably 0 [wt %] or more and 10 [wt %] or less. The first gate electrode film 3A may contain 0 [wt %] or more and 1 [wt %] or less of Cu and/or Si.

The second gate electrode film 3B is a single-layer or a multi-layer conductive film. The film resistance of the second gate electrode film 3B is preferably lower than the film resistance of the first gate electrode film 3A. The second gate electrode film 3B contains elements contained in the first field plate electrode 6. The second gate electrode film 3B contains a metal, an alloy, and/or a metal nitride. The second gate electrode film 3B preferably contains M3Al (alloy containing M3 element and aluminum) and/or M4AlN (nitride containing M4 element and Al). The second gate electrode film 3B preferably contains M3Al or M4AlN. M3 is one or more kinds selected from the group consisting of Ti, Nb, V, and Zr. The second gate electrode film 3B preferably includes a region not containing Al. The region not containing Al of the second gate electrode film 3B is preferably M3 and/or M4N, and is preferably M3 or M4N. M3 preferably contains Ti, and is more preferably Ti. M4 is one or more kinds selected from the group consisting of Ti, W, Ta, and Zr. M4 preferably contains Ti, and is more preferably Ti. The first gate electrode film 3A contains, for example, one or more kinds selected from the group consisting of AlTiW and AlTiTa, and preferably contains one kind selected from the group consisting of AlTi, AlW, and AlTa. Al contained in the second gate electrode film 3B is preferably 0 [wt %] or more and 10 [wt %] or less. The second gate electrode film 3B may contain 0 [wt %] or more and 1 [wt %] or less of Cu and/or Si.

The M1 element of the first gate electrode film 3A preferably includes one or more kinds of elements selected from the group consisting of one or more kinds of elements included in the second gate electrode film 3B as the M3 element and/or one or more kinds of elements included in the second gate electrode film 3B as the M4 element.

It is preferable that one of the first gate electrode film 3A and the second gate electrode film 3B has strong tensile stress, and the other has strong compressive stress. When this relationship is satisfied, the stress of one of the first gate electrode film 3A and the second gate electrode film 3B can be relaxed by the stress of the other. From the viewpoint of stress relaxation, the first gate electrode film 3A and the second gate electrode film 3B are preferably films having different compositions. In the case of films having different compositions, the kinds of elements contained in the first gate electrode film 3A and the second gate electrode film 3B are not the same (partially or entirely different), or the kinds of elements contained in the first gate electrode film 3A and the second gate electrode film 3B are the same, but the element ratios are different.

From the viewpoint of stress relaxation, the combination of the first gate electrode film 3A and the second gate electrode film 3B (first gate electrode film 3A/second gate electrode film 3B) is preferably TiN/Ti, TiW/Ti, TaN/Ta, or TaW/Ta. After the elements of the first field plate electrode 6 are diffused, these elements contain Al and the like. When Al is contained, the combination of the first gate electrode film 3A and the second gate electrode film 3B (first gate electrode film 3A/second gate electrode film 3B) is preferably AlTiN/AlTi, AlTiW/AlTi, AlTaN/AlTa, or AlTaW/AlTa.

FIGS. 3A, 3B, 3C, and 3D are schematic cross-sectional views in which a portion of the gate electrode 3 is enlarged. A description will be given as to the relationship between the position of the lower end of the first field plate electrode 6 and the first gate electrode film 3A and/or the relationship between a position of a lower end of the first field plate electrode 6 and the second gate electrode film 3B with reference to the schematic cross-sectional view of FIG. 3. In any form of FIGS. 3A, 3B, 3C, and 3D, the lower end of the first field plate electrode 6 is located on the second surface in contact with the second gate electrode film 3B rather than the first surface in contact with the gate insulating film 2 of the first gate electrode film 3A.

Figure 3A:
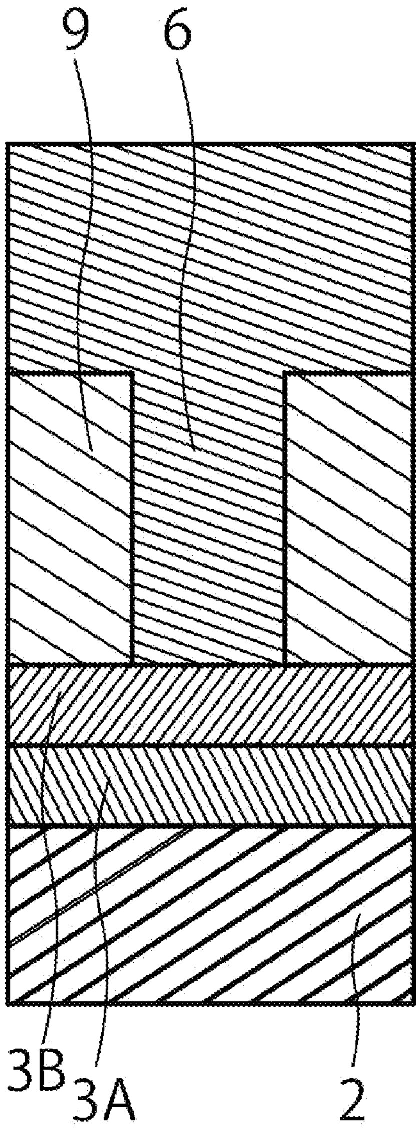
FIG. 3A is a schematic cross-sectional diagram of a semiconductor device according to an embodiment.

FIG. 3A illustrates a form in which a lower end surface of the first field plate electrode 6 and the upper end surface of the second gate electrode film 3B are in direct contact with each other. The second gate electrode film 3B and the first field plate electrode 6 are in direct contact with each other. FIG. 3A illustrates a form in which the contact area between the second gate electrode film 3B and the first field plate electrode 6 is small. Since a thickness of the first gate electrode film 3A does not change depending on a position and shape of the first field plate electrode 6, a barrier property for preventing Al from diffusing into the gate insulating film 2 is high.

Figure 3B:
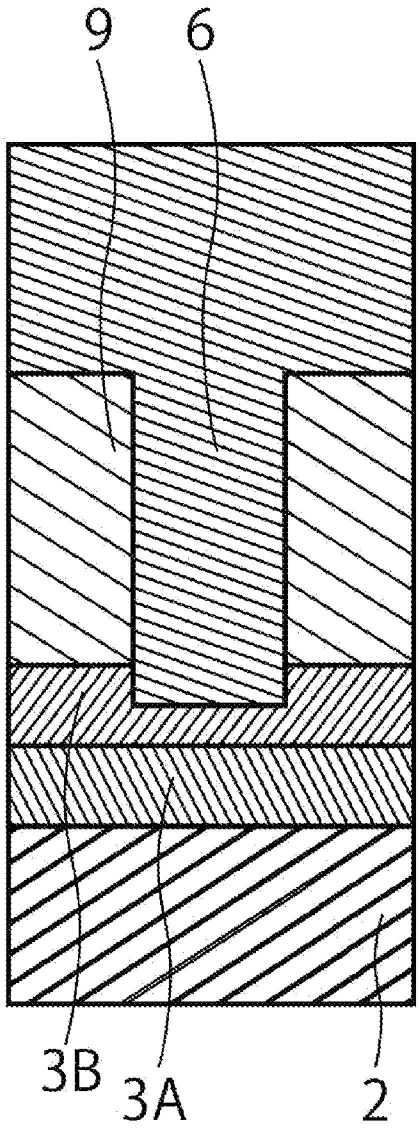
FIG. 3B is a schematic cross-sectional diagram of a semiconductor device according to an embodiment.

FIG. 3B illustrates a form in which the lower end of the first field plate electrode 6 is embedded in the second gate electrode film 3B, and the first field plate electrode 6 does not penetrate the second gate electrode film 3B. The lower end of the first field plate electrode 6 and a part of a side surface on the lower end side of the first field plate electrode 6 are in direct contact with the second gate electrode film 3B. Since a thickness of the first gate electrode film 3A does not change depending on a position and shape of the first field plate electrode 6, a barrier property for preventing Al from diffusing into the gate insulating film 2 is high.

Figure 3C:
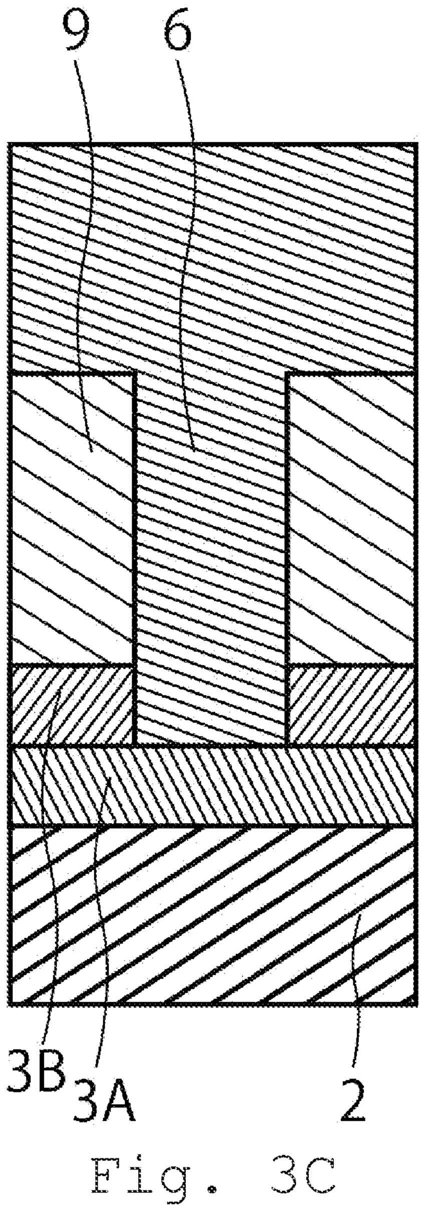
FIG. 3C is a schematic cross-sectional diagram of a semiconductor device according to an embodiment.

FIG. 3C illustrates a form in which the first field plate electrode 6 penetrates the second gate electrode film 3B, and the lower end surface of the first field plate electrode 6 and the upper end surface of the first gate electrode film 3A are in direct contact with each other. The first field plate electrode 6 is not embedded in the first gate electrode film 3A. A part of the side surface on the lower end side of the first field plate electrode 6 is in direct contact with the second gate electrode film 3B. Since a thickness of the first gate electrode film 3A does not change depending on a position and shape of the first field plate electrode 6, a barrier property for preventing Al from diffusing into the gate insulating film 2 is high.

Figure 3D:
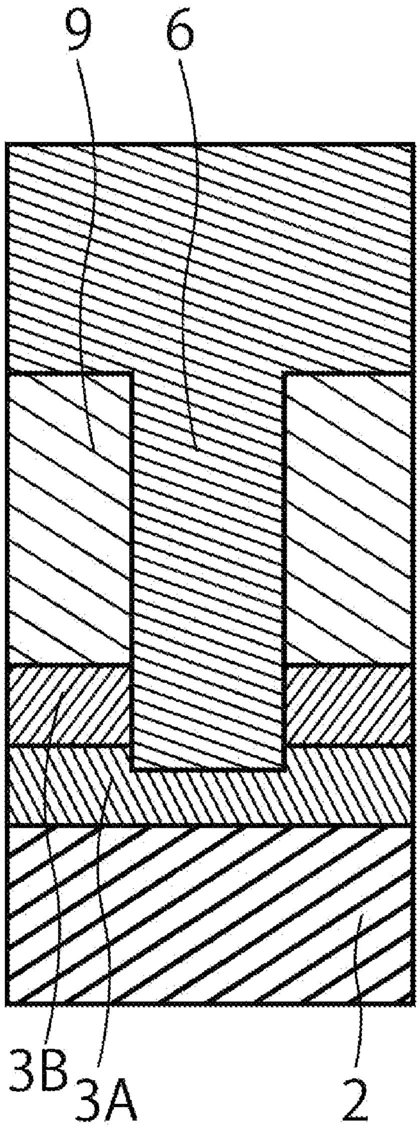
FIG. 3D is a schematic cross-sectional diagram of a semiconductor device according to an embodiment.

FIG. 3D illustrates a form in which the first field plate electrode 6 penetrates the second gate electrode film 3B, the first field plate electrode 6 does not penetrate the first gate electrode film 3A, and the lower end side of the first field plate electrode 6 is embedded in the first gate electrode film 3A. The first field plate electrode 6 is not embedded in the first gate electrode film 3A. A part of the side surface on the lower end side of the first field plate electrode 6 is in direct contact with the second gate electrode film 3B. The thickness of the first gate electrode film 3A changes depending on the position of the lower end of the first field plate electrode 6, but since the gate electrode 3 has the two-layer structure of the embodiment, a minimum thickness of the first gate electrode film 3A can be set to a sufficient thickness. Also in the form illustrated in FIG. 3D, the barrier property for preventing Al from diffusing into the gate insulating film 2 is sufficiently high.

The minimum thickness and a maximum thickness of the first gate electrode film 3A are preferably 10 [nm] or more and 100 [nm] or less. When the thickness of the first gate electrode film 3A is large, a resistance of the gate electrode 3 increases. When the thickness of the first gate electrode film 3A is large, the first gate electrode film 3A and the gate insulating film 2 are easily peeled off. When the thickness of the first gate electrode film 3A is thin, the metal contained in the first field plate electrode 6 is easily diffused into the gate insulating film 2 when the first field plate electrode 6 is alloyed. That is, when the thickness of the first gate electrode film 3A is thin, the function as a barrier metal deteriorates.

The thicknesses of the first gate electrode film 3A and the second gate electrode film 3B are the lengths of the first gate electrode film 3A and the second gate electrode film 3B in the stacking direction of the first gate electrode film 3A and the second gate electrode film 3B. The thickness of the first gate electrode film 3A can be obtained from a cross-sectional view in the same direction as the schematic cross-sectional view of FIG. 1.

The minimum thickness of the first gate electrode film 3A is the thickness of the portion where the thickness of the first gate electrode film 3A is the thinnest. When the first field plate electrode 6 is embedded in the first gate electrode film 3A, the minimum thickness of the first gate electrode film 3A is the thinnest portion of the portion of the first gate electrode film 3A where the first field plate electrode 6 is embedded and recessed.

The maximum thickness of the first gate electrode film 3A is the thickness of the thickest portion of the first gate electrode film 3A. When the first field plate electrode 6 is embedded in the first gate electrode film 3A, the maximum thickness of the first gate electrode film 3A is the thickest portion of the first gate electrode film 3A excluding the portion where the first field plate electrode 6 is embedded and recessed.

The minimum thickness of the first gate electrode film 3A is preferably 10 [nm] or more and 200 [nm] or less, and more preferably 10 [nm] or more and 100 [nm] or less.

The maximum thickness of the first gate electrode film 3A is preferably 10 [nm] or more and 200 [nm] or less, and more preferably 10 [nm] or more and 100 [nm] or less.

When a difference between the minimum thickness and the maximum thickness of the first gate electrode film 3A is large, a stress difference in the first gate electrode film 3A may be large. The maximum thickness of the first gate electrode film 3A is preferably 2.0 times or more and 1.0 times or less, and more preferably 1.5 times or more and 1.0 times or less the minimum thickness of the first gate electrode film 3A. When the above-described thickness relationship is satisfied, the minimum thickness of the first gate electrode film 3A is preferably 10 [nm] or more and 200 [nm] or less, and the maximum thickness of the first gate electrode film 3A is preferably 10 [nm] or more and 200 [nm] or less.

In a case where the first field plate electrode 6 is embedded in the first gate electrode film 3A, when the difference between the minimum thickness and the maximum thickness of the first gate electrode film 3A is large, the stress difference in the first gate electrode film 3A may increase. The maximum thickness of the first gate electrode film 3A is preferably 0.3 times or more and 0.9 times or less, and more preferably 0.5 times or more and 0.9 times or less the minimum thickness of the first gate electrode film 3A. When the above-described thickness relationship is satisfied, the minimum thickness of the first gate electrode film 3A is preferably 10 [nm] or more and 200 [nm] or less, and the maximum thickness of the first gate electrode film 3A is preferably 10 [nm] or more and 200 [nm] or less.

The maximum thickness of the second gate electrode film 3B is preferably 10 [nm] or more and 100 [nm] or less. When the thickness of the second gate electrode film 3B is large, a thickness of the electrode increases and a step of the gate electrode increases, resulting in poor coverage of the insulating film formed thereon. When the thickness of the first gate electrode film 3A is thin, the first field plate electrode 6 easily penetrates the first gate electrode film 3A. When the thickness of the first gate electrode film 3A is thin, the effect of stress relaxation is reduced. The maximum thickness of the second gate electrode film 3B is preferably 10 [nm] or more and 100 [nm] or less, and more preferably [nm] or more and 50 [nm] or less. There is a case where the second gate electrode film 3B is penetrated by the first field plate electrode 6 (minimum thickness of second gate electrode film 3B is 0 [nm]).

The ratio of the maximum thickness of the first gate electrode film 3A to the maximum thickness of the second gate electrode film 3B (maximum thickness of second gate electrode film 3B/maximum thickness of first gate electrode film 3A) is preferably 0.3 or more and 2.0 or less, and more preferably 0.5 or more and 1.5 or less.

The area of the first gate electrode film 3A (area of surface of first gate electrode film 3A facing second gate electrode film 3B) is preferably 0.5 times or more and 1.5 times or less, more preferably 0.8 times or more and 1.2 times or less the area of the second gate electrode film 3B (area of surface of second gate electrode film 3B facing first gate electrode film 3A).

The semiconductor device 100 includes the first field plate electrode 6. By providing the field plate electrode, electric field concentration on the electrode can be relaxed. A portion surrounded by a broken line in FIG. 2 represents the first field plate electrode 6. The first field plate electrode 6 is a gate field plate electrode (hereinafter, gate FP electrode) connected to the gate electrode 3. The gate FP electrode 6 is not limited to the shape and structure for the purpose of electric field relaxation, and may be used as a wiring member for reducing the wiring resistance on the gate side. The gate FP electrode 6 is connected to the gate electrode 3 having a relatively high resistance, and the resistance between the gate electrode 3 and the gate FP electrode 6 decreases.

The gate FP electrode 6 is provided on the gate electrode 3. The gate FP electrode 6 is electrically and directly connected to the gate electrode 3. The gate FP electrode 6 includes, for example, a columnar portion in contact with the gate electrode 3 and a plate-like portion in contact with the columnar portion. The columnar portion is a portion of the gate FP electrode 6 sandwiched between the first interlayer insulating films 9, and a portion other than the columnar portion is the plate-like portion. The plate-like portion of the gate FP electrode 6 may have a step or may be flat. The columnar portion is sandwiched between the plate-like portion and the gate electrode 3. The width of the plate-like portion of the gate FP electrode 6 in the second direction is preferably longer than a width of the gate electrode 3 in the second direction. The width of the columnar portion of the gate FP electrode 6 in the second direction is preferably shorter than the width of the gate electrode 3 in the second direction. Another gate FP electrode (not illustrated) connected to the gate electrode 3 can be provided between the gate FP electrode 6 and the third electrode 5. The end surface of the gate FP electrode 6 (including freely used gate FP electrode (not illustrated)) on the side of the third electrode 5 is preferably located closer to the second electrode 4 than the end surface of the second field plate electrode 7 on the side of the third electrode 5 in the second direction.

The gate FP electrode 6 is a conductor mainly made of Al. The gate FP electrode 6 contains Al in an amount of 80 [wt %] or more, preferably 90 [wt %] or more, more preferably 95 [wt %] or more, and further more preferably 99 [wt %] or more. The gate FP electrode 6 preferably contains one or more kinds selected from the group consisting of Cu, Si, and Ti in addition to Al.

Preferably, the gate FP electrode 6 and the second gate electrode film 3B are in ohmic contact. The second gate electrode film 3B and the first gate electrode film 3A are preferably in ohmic contact.

A length of the plate-like portion of the gate FP electrode 6 in the second direction (Y direction) is preferably equal to or longer than a length of the first gate electrode film 3A in the second direction, and more preferably 1.1 times or more and 2.5 times or less the length of the first gate electrode film 3A in the second direction.

An end of the gate FP electrode 6 on the side of a source electrode 4 is preferably located closer to the source electrode 4 than an end of the first gate electrode film 3A on the side of the source electrode 4. An end of the gate FP electrode 6 on the side of a drain electrode 5 is preferably located closer to the drain electrode 5 than the end of the first gate electrode film 3A on the side of the drain electrode 5.

The length of the plate-like portion of the gate FP electrode 6 in the second direction (Y direction) is preferably equal to or longer than a length of the second gate electrode film 3B in the second direction, and more preferably 1.1 times or more and 2.5 times or less the length of the second gate electrode film 3B in the second direction.

The end of the gate FP electrode 6 on the side of the source electrode 4 is preferably located closer to the source electrode 4 than an end of the second gate electrode film 3B on the side of the source electrode 4. The end of the gate FP electrode 6 on the side of the drain electrode 5 is preferably located closer to the drain electrode 5 than the end of the second gate electrode film 3B on the side of the drain electrode 5.

A length of the columnar portion of the gate FP electrode 6 in the second direction (Y direction) is preferably less than the length of the first gate electrode film 3A in the second direction, and more preferably 0.2 times or more and 0.9 times or less the length of the first gate electrode film 3A in the second direction. The length of the first gate electrode film 3A in the second direction is preferably 150 [nm] or more longer than the length of the columnar portion of the gate FP electrode 6 in the second direction, and more preferably 150 [nm] or more and 1,000 [nm] or less longer than the length of the columnar portion of the gate FP electrode 6 in the second direction.

The length of the columnar portion of the gate FP electrode 6 in the second direction (Y direction) is preferably less than the length of the second gate electrode film 3B in the second direction, and more preferably 0.2 times or more and 0.9 times or less the length of the second gate electrode film 3B in the second direction. The length of the second gate electrode film 3B in the second direction is preferably 150 [nm] or more longer than the length of the columnar portion of the gate FP electrode 6 in the second direction, and more preferably 150 [nm] or more and 1,000 [nm] or less longer than the length of the columnar portion of the gate FP electrode 6 in the second direction.

The second electrode 4 is a source electrode having a plurality of fingers extending in the first direction. The respective comb-shaped fingers of the source electrode 4 extend in the first direction, and the respective fingers are arranged in the second direction (Y direction). For example, the finger of the source electrode 4 is sandwiched between the fingers of the gate electrode 3. The source electrode 4 is provided on the semiconductor layer 1, more specifically, on the channel layer 1C and the barrier layer 1D. The source electrode 4 is electrically connected to the channel layer 1C and the barrier layer 1D. For example, the source electrode 4 or the second field plate electrode 7 is connected to a second electrode pad (source electrode pad) 4A. When the second field plate electrode 7 is connected to the second electrode pad 4A, for example, the source electrode 4 has a shape of only a finger portion.

The source electrode 4 is, for example, a metal electrode. The source electrode 4 is, for example, an aluminum film mainly containing aluminum and containing 50 [wt %] or more of aluminum, an aluminum alloy film containing 50 [wt %] or more of aluminum, or a stacked film of titanium (Ti) and aluminum (Al). An ohmic contact is desirably formed between the source electrode 4 and the barrier layer 1D.

The semiconductor device 100 preferably includes the second field plate electrode 7. By providing the field plate electrode, electric field concentration on the electrode can be relaxed. A portion surrounded by a two-dot chain line in FIG. 2 represents the second field plate electrode 7. The second field plate electrode 7 is a source field plate electrode (hereinafter, first source FP electrode) connected to the source electrode 4. The first source FP electrode 7 is located above the source electrode 4, the gate electrode 3 sandwiching the intermediate source electrode 4, and the gate FP electrode 6 so as to cover the source electrode 4, the gate electrode 3, and the gate FP electrode 6 such that the source electrode 4 is located in the middle or substantially in the middle.

The first source FP electrode 7 is a conductor mainly made of Al. The first source FP electrode 7 contains Al in an amount of 80 [wt %] or more, preferably 90 [wt %] or more, more preferably 95 [wt %] or more, and further more preferably 99 [wt %] or more. The gate FP electrode 6 preferably contains one or more kinds selected from the group consisting of Cu, Si, and Ti in addition to Al.

The third electrode 5 is a drain electrode having a plurality of fingers extending in the first direction (X direction). The respective comb-shaped fingers of the drain electrode 5 extend in the first direction, and the respective fingers are arranged in the second direction (Y direction). The fingers of the drain electrode 5 are provided in the opposite direction to the fingers of the source electrode 4, that is, so that the source electrode 4 and the drain electrode 5 face each other. The drain electrode 5 is provided on the channel layer 1C and the barrier layer 1D. The drain electrode 5 is electrically connected to the channel layer 1C and the barrier layer 1D. The drain electrode 5 is in contact with, for example, the barrier layer 1D. For example, the drain electrode 5 or the third field plate electrode 8 (drain FP electrode) is connected to a third electrode pad (drain electrode pad) 5A. When the drain FP electrode 8 is connected to the third electrode pad 5A, for example, the drain electrode 5 has a shape of only a finger portion.

The drain electrode 5 is, for example, a metal electrode. The drain electrode 5 is, for example, an aluminum film mainly containing aluminum and containing 50 [wt %] or more of aluminum, an aluminum alloy film containing 50 [wt %] or more of aluminum, or a stacked film of titanium (Ti) and aluminum (Al). An ohmic contact is desirably formed between the drain electrode 5 and the barrier layer 1D.

A distance between the source electrode 4 and the drain electrode 5 is, for example, 5 [μm] or more and 30 [μm] or less.

The source electrode 4 and the drain electrode can be in direct contact with the channel layer 1C.

The drain FP electrode 8 is a conductor mainly made of Al. The drain FP electrode 8 contains Al in an amount of 80 [wt %] or more, preferably 90 [wt %] or more, more preferably 95 [wt %] or more, and further more preferably 99 [wt %] or more. The gate FP electrode 6 preferably contains one or more kinds selected from the group consisting of Cu, Si, and Ti in addition to Al.

The second insulating film 9 is an interlayer insulating film (hereinafter, first interlayer insulating film 9). The first interlayer insulating film 9 is provided between the gate insulating film 2 and the third insulating film 10. The first interlayer insulating film 9 covers the gate electrode 3, the source electrode 4, and the drain electrode 5. The first interlayer insulating film 9 is, for example, an oxide or a nitride. The first interlayer insulating film 9 is, for example, silicon oxide ($SiO_2$), silicon nitride (SiN), a high dielectric constant (high-k) material, or the like. Examples of the high-k material include hafnium oxide ($HfO_2$) and the like. The first interlayer insulating film 9 is an insulating film having a low density. The first interlayer insulating film 9 is an insulating film having a density lower than that of the gate insulating film 2. Further, the thickness of the first interlayer insulating film 9 is larger than that of the gate insulating film 2, and is, for example, 20 [nm] or more to 500 [nm] or less. In the semiconductor device 100 of FIG. 1, the first interlayer insulating film 9 has a step. By planarizing the first interlayer insulating film 9 after the formation of the first interlayer insulating film 9, the first interlayer insulating film 9 having no step can be adopted for the semiconductor device 100.

The third insulating film 10 is an interlayer insulating film (hereinafter, second interlayer insulating film 10). The second interlayer insulating film 10 is provided on the first interlayer insulating film 9. The second interlayer insulating film 10 covers the gate FP electrode 6, the source electrode 4, and the drain electrode 5. The second interlayer insulating film 10 is, for example, an oxide or a nitride. The second interlayer insulating film 10 is, for example, silicon oxide ($SiO_2$), silicon nitride (SiN), a high dielectric constant (high-k) material, or the like. Examples of the high-k material include hafnium oxide ($HfO_2$) and the like. The thickness of the second interlayer insulating film 10 is larger than that of the gate insulating film 2, and is, for example, 50 [nm] or more and 2,000 [nm] or less.

Figure 4:
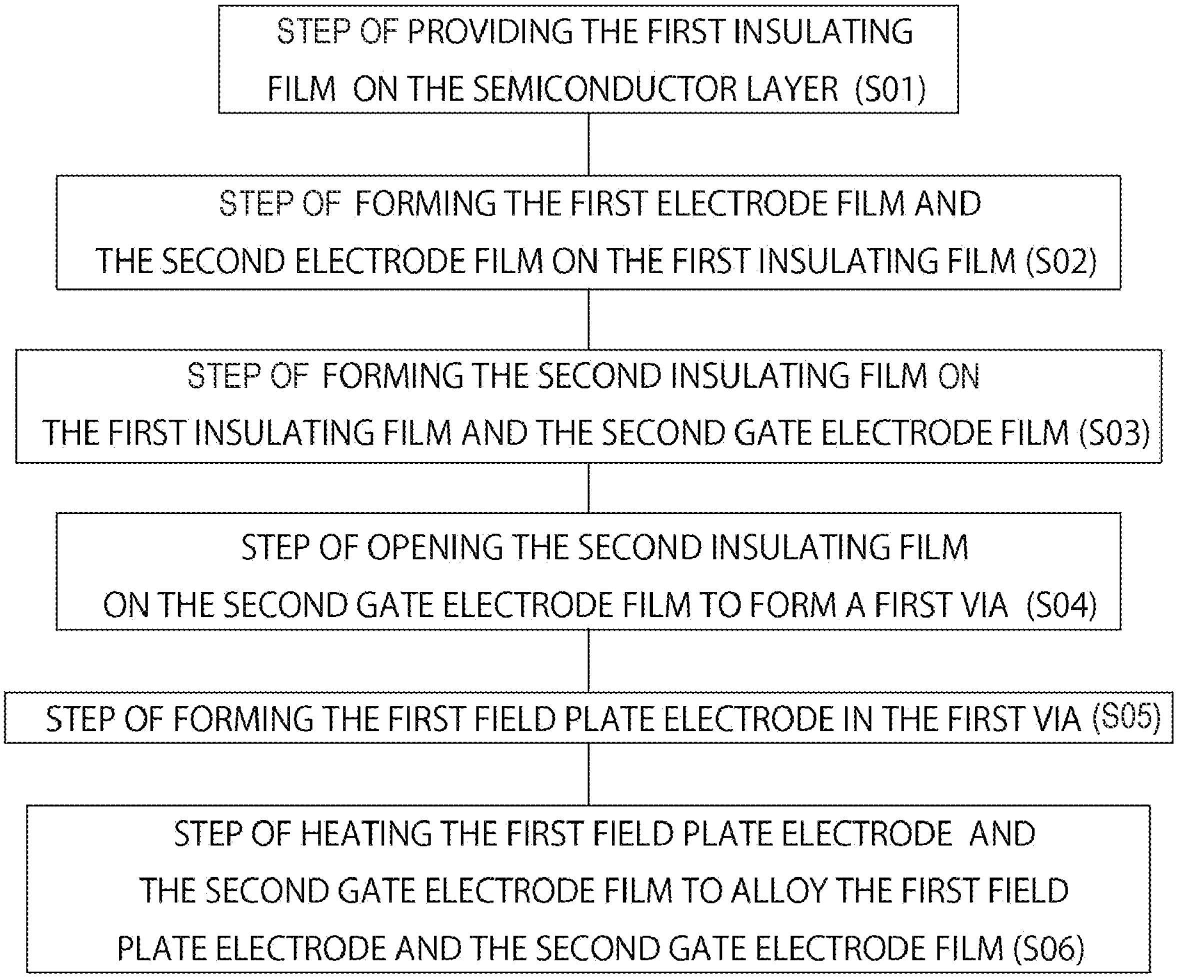
FIG. 4 is a schematic process diagram of a semiconductor device according to an embodiment.

Hereinafter, a description will be given as to a method of manufacturing the semiconductor device 100 with reference to process schematic diagrams of FIGS. 5 to 13. FIG. 4 shows a flowchart of a method of manufacturing the semiconductor device 100. A method of manufacturing the semiconductor device 100 includes: a step (S01) of providing the first insulating film (gate insulating film) 2 on the semiconductor layer 1; a step (S02) of forming the first electrode film (first gate electrode film) 3A and the second electrode film (second gate electrode film) 3B on the first insulating film 2; a step (S03) of forming the second insulating film (first interlayer insulating film) 9 on the first insulating film 2 and the second gate electrode film 3B; a step (S04) of opening the second insulating film 9 on the second gate electrode film 3B to form a first via V1; a step (S05) of forming the first field plate electrode (gate FP electrode) 6 in the first via V1; and a step (S06) of heating the first field plate electrode 6 and the second gate electrode film 3B to alloy the first field plate electrode 6 and the second gate electrode film 3B.

Figure 5:
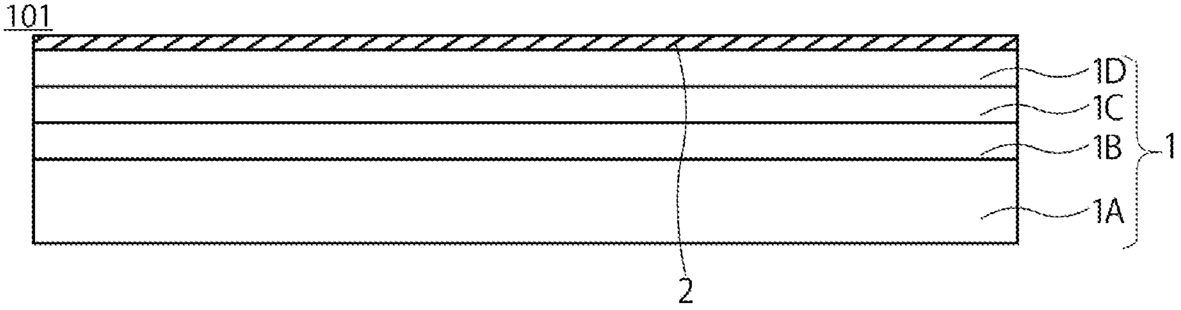
FIG. 5 is a schematic process diagram of a semiconductor device according to an embodiment.

A description will be given as to the step (S01) of providing the first insulating film (gate insulating film) 2 on the semiconductor layer 1 with reference to the process schematic diagram of FIG. 5. By providing the gate insulating film 2 on the semiconductor layer 1, it is possible to obtain a member 101 in which the gate insulating film 2 is provided on the semiconductor layer 1. For example, SiN or $SiO_2$ is formed by plasma chemical vapor deposition (CVD).

Figure 6:
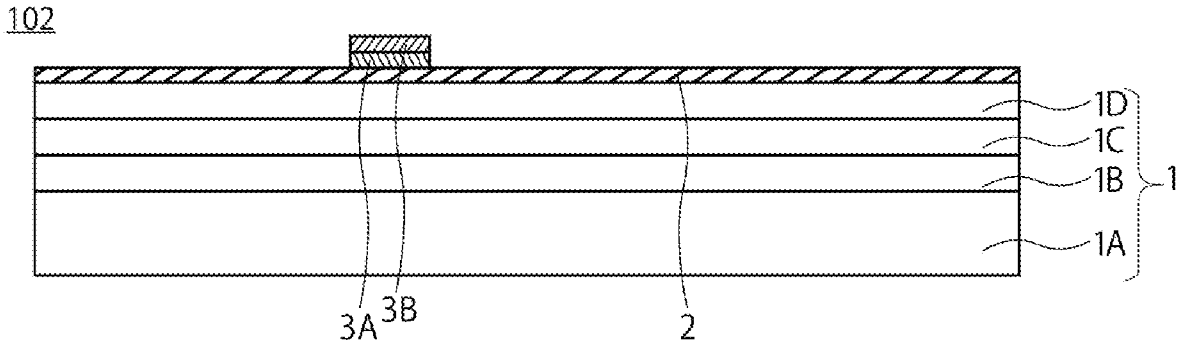
FIG. 6 is a schematic process diagram of a semiconductor device according to an embodiment.

A description will be given as to the step (S02) of forming the first gate electrode film 3A and the second gate electrode film 3B on the gate insulating film 2 with reference to the process schematic diagram of FIG. 6. For example, the solid first gate electrode film 3A is formed on the gate insulating film 2 of the member 101. For example, the solid second gate electrode film 3B is formed on the solid first gate electrode film 3A. Then, the first gate electrode film 3A and the second gate electrode film 3B are patterned. Then, a member 102 provided with the first gate electrode film 3A and the second gate electrode film 3B patterned and stacked on the gate insulating film 2 is obtained.

In the step (S02) of forming the first gate electrode film 3A and the second gate electrode film 3B on the gate insulating film 2, for example, the first gate electrode film 3A is obtained by forming a film of one or more kinds or one kind selected from the group consisting of TiN, WN, and TaN by sputtering. When Al is diffused from the gate FP electrode 6 into the TiN film by alloying treatment by heating, a portion where Al is diffused becomes TiAlN, and the first gate electrode film 3A becomes a TiAlN film.

In the step (S02) of forming the first gate electrode film 3A and the second gate electrode film 3B on the gate insulating film 2, for example, the second gate electrode film 3B is obtained by forming a film of one or more kinds or one kind selected from the group consisting of Ti, W, and Ta by sputtering. When Al is diffused from the gate FP electrode 6 into the Ti film by the alloying treatment by heating, the diffused portion becomes a TiAl alloy, and the second gate electrode film 3B becomes a TiAl film.

Figure 7:
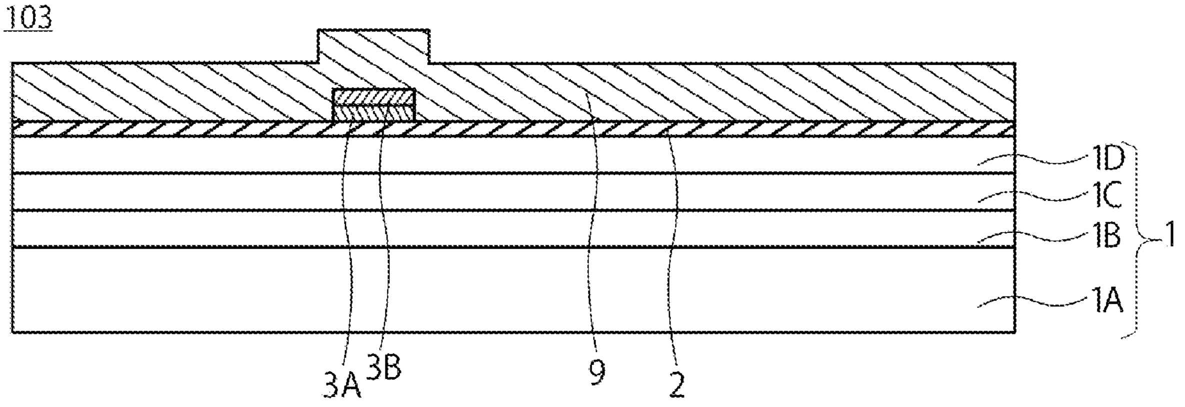
FIG. 7 is a schematic process diagram of a semiconductor device according to an embodiment.

A description will be given as to the step (S03) of forming the first interlayer insulating film 9 on the first insulating film 2 and the second gate electrode film 3B with reference to the process schematic diagram of FIG. 7. The first interlayer insulating film 9 is formed on the gate insulating film 2 and the second gate electrode film 3B of the member 102, thereby obtaining a member 103. After the formation of the first interlayer insulating film 9, planarization processing may be performed by chemical mechanical polishing (CMP) or the like as necessary.

Figure 8:
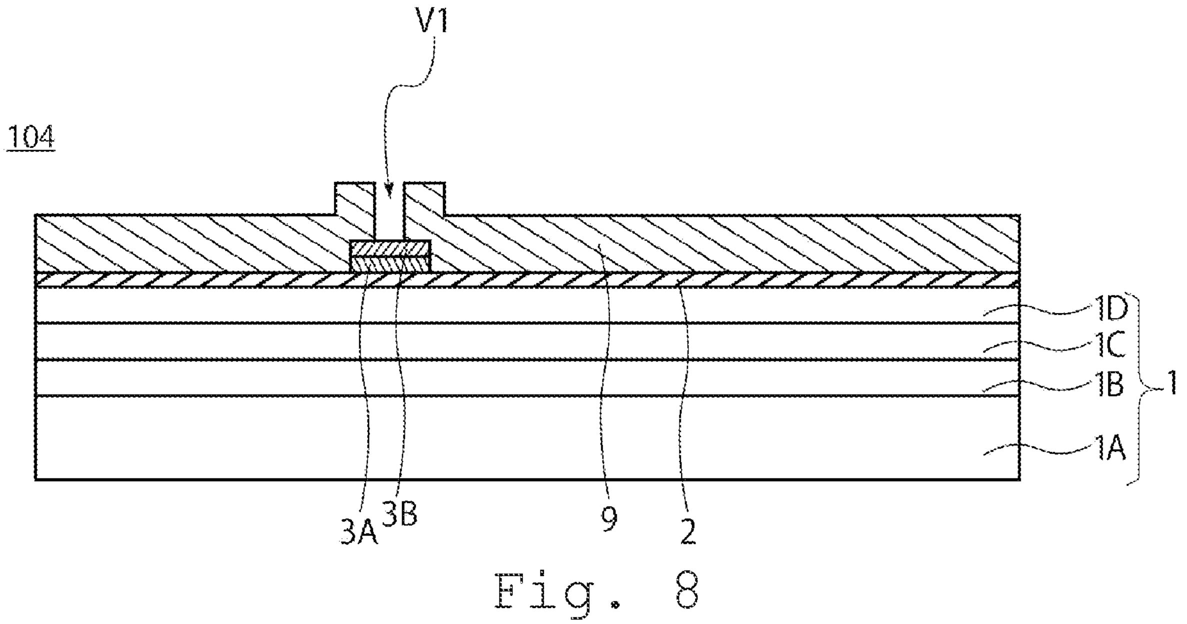
FIG. 8 is a schematic process diagram of a semiconductor device according to an embodiment.

A description will be given as to the step (S04) of forming the first via V1 by opening the first interlayer insulating film 9 on the second gate electrode film 3B with reference to the process schematic diagram of FIG. 8. The first interlayer insulating film 9 of the member 103 is opened to form the first via V1. In the first via V1, the first interlayer insulating film 9 is processed by etching using a mask, for example, so that the second gate electrode film 3B is exposed, thereby obtaining a member 104. The first via V1 penetrates the first interlayer insulating film 9. The first via V1 may penetrate the second gate electrode film 3B, but does not penetrate the first gate electrode film 3A. When penetrating the first gate electrode film 3A, a barrier property of the first gate electrode film 3A is greatly reduced, and as such, Al and Ti are diffused into the gate insulating film 2 during the heating treatment, and the gate insulating film 2 is easily broken.

The minimum thickness of the first gate electrode film 3A after the first via V1 processing is preferably 10 [nm] or more and 200 [nm] or less, and more preferably 10 [nm] or more and 100 [nm] or less. The maximum thickness of the first gate electrode film 3A after the first via V1 processing is preferably 10 [nm] or more and 200 [nm] or less, and more preferably [nm] or more and 100 [nm] or less.

Typically, the diameter (maximum diameter) of the first via V1 is preferably 100 [nm] or more and 1,000 [nm] or less.

Figure 9:
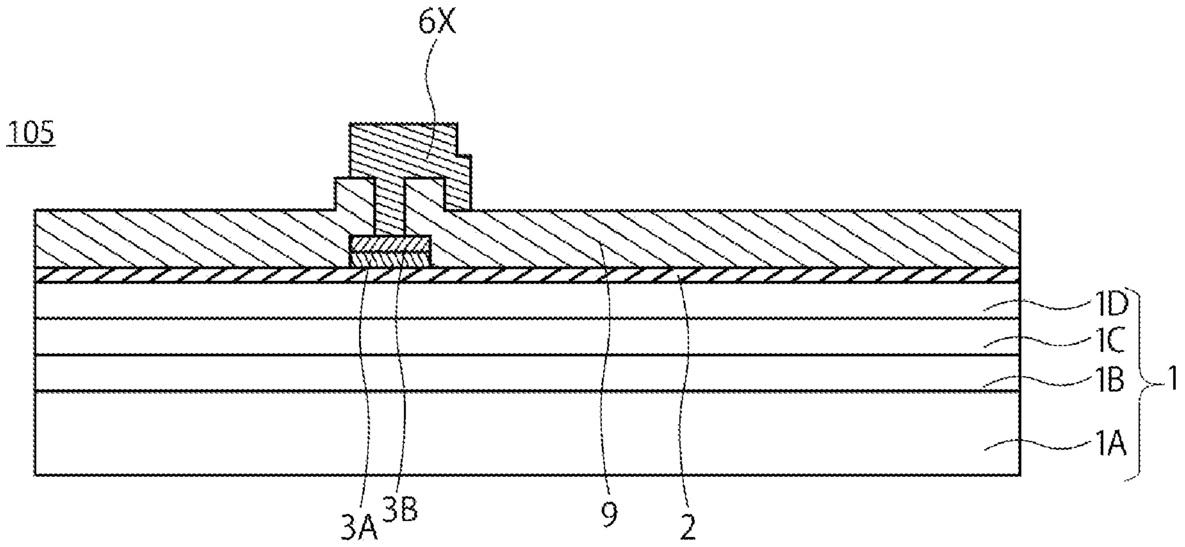
FIG. 9 is a schematic process diagram of a semiconductor device according to an embodiment.

A description will be given as to the step (S05) of forming the first field plate electrode (gate FP electrode) 6 in the first via V1 with reference to the process schematic diagram of FIG. 9. A gate FP electrode 6X (gate FP electrode 6 before heating is illustrated as gate FP electrode 6X) is formed in the first via V1 of the member 104 and on the first interlayer insulating film 9 to obtain a member 105. A solid film of a conductive material mainly composed of Al is formed on the first interlayer insulating film 9 and in the first via V1, and processed into the shape of the gate FP electrode 6 to form the gate FP electrode 6. The conductive material mainly composed of Al contains Al in an amount of 80 [wt %] or more, preferably 90 [wt %] or more, more preferably 95 [wt %] or more, and further more preferably 99 [wt %] or more. The gate FP electrode 6 before the heating treatment may contain Cu and/or Si in addition to Al.

Figure 10:
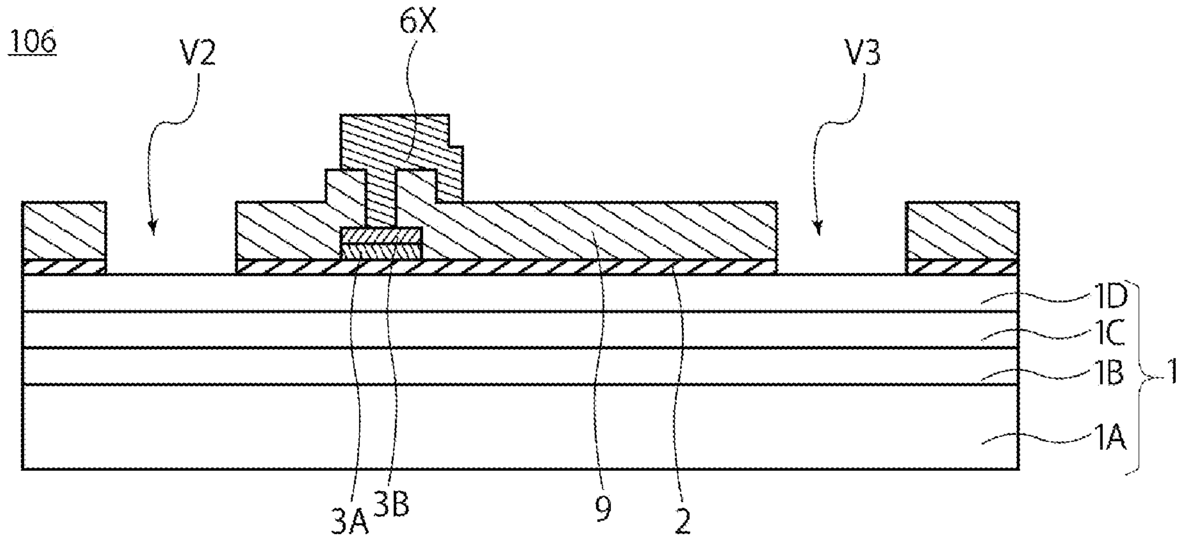
FIG. 10 is a schematic process diagram of a semiconductor device according to an embodiment.

A description will be given as to the step (S06) of heating the first field plate electrode 6 and the second gate electrode film 3B to alloy the first field plate electrode 6 and the second gate electrode film 3B with reference to the process schematic diagram of FIG. 10. The alloying treatment by heating is performed after the step (S05) of forming the first field plate electrode (gate FP electrode) 6 in the first via V1. The heating treatment including the alloying treatment by heating may be performed on any one of the member 105, a member 106, a member 107, a member 108, a member 109, and a member 110. The heating treatment including the alloying treatment by heating can be performed a plurality of times.

Typically, the alloying treatment by heating is preferably performed at 550° C. or more and 650° C. for 10 minutes or more and 60 minutes or less. The heating is preferably performed in the N2 atmosphere. When the heating treatment is performed, metals contained in the second gate electrode film 3B and the gate FP electrode 6 diffuse to each other, and as such, the second gate electrode film 3B and the gate FP electrode 6 are alloyed.

For example, when the second gate electrode film 3B contains Ti and the gate FP electrode 6 contains Al, Ti diffuses into the gate FP electrode 6 to alloy Al and Ti in the gate FP electrode 6, and Al diffuses into the second gate electrode film 3B to alloy Ti and Al in the second gate electrode film 3B.

A description will also be given as to formation of the source electrode 4, the drain electrode 5, the first source FP electrode 7, the drain FP electrode 8, and the second interlayer insulating film 10 with reference to FIGS. 11 to 14.

Figure 11:
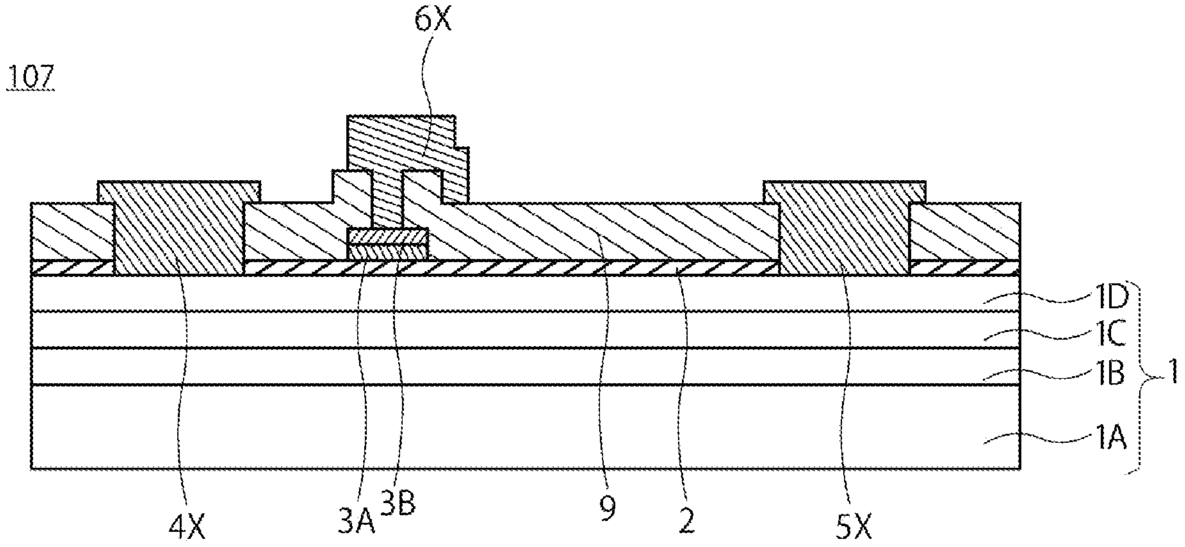
FIG. 11 is a schematic process diagram of a semiconductor device according to an embodiment.

The process schematic diagram of FIG. 11 relates to a step of forming a second via V2 for the source electrode 4 and a third via V3 for the drain electrode 5 in the member 105. In this step, it is possible to obtain the member 106 in which the second via V2 penetrating the gate insulating film 2 and the first interlayer insulating film 9 and the third via V3 penetrating the gate insulating film 2 and the first interlayer insulating film 9 are formed. The gate electrode 3 illustrated in the process schematic diagram of FIG. 11 is sandwiched between the second via V2 and the third via V3 in the Y direction. The second via V2 and the third via V3 are formed by, for example, etching using a mask.

The process schematic diagram of FIG. 11 relates to a step of forming the source electrode 4 and the drain electrode 5 in the member 106. In the process schematic diagram of FIG. 11, an electrode before the heating treatment for alloying is formed. Therefore, in the process schematic diagram of FIG. 11 and the like, the precursor of the source electrode 4 before alloying by the heating treatment is shown as a source electrode 4X, and the precursor of the drain electrode 5 before alloying by the heating treatment is shown as a drain electrode 5X. The source electrode 4X and the drain electrode 5X are formed in the member 106 to obtain the member 107 of FIG. 11. A metal film is formed in the member 106 and patterned to obtain the member 107 in which the source electrode 4X and the drain electrode 5X are formed.

Figure 12:
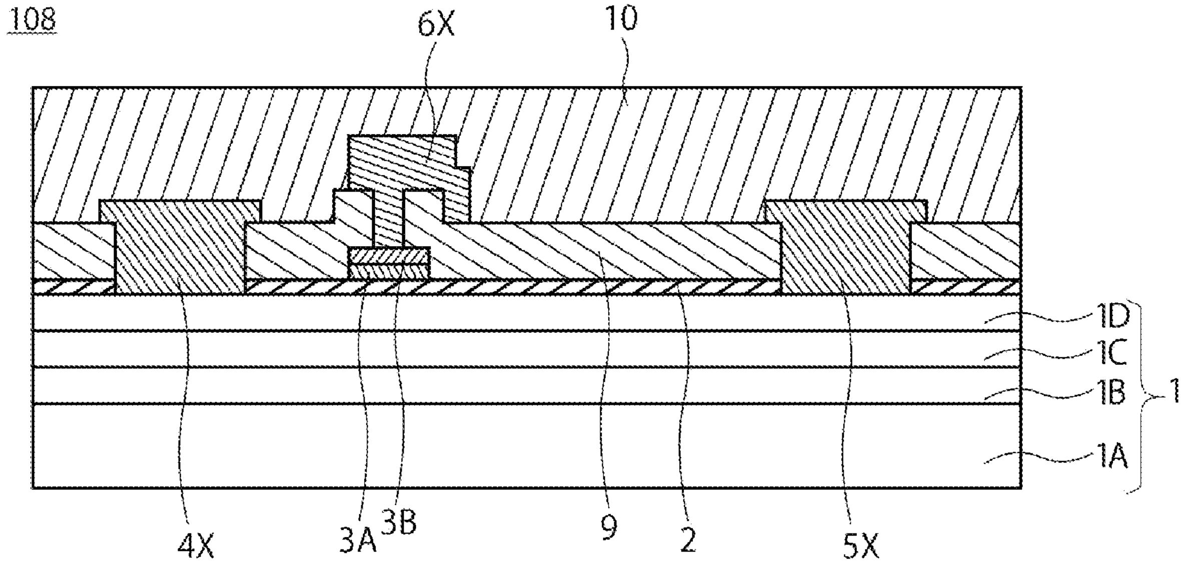
FIG. 12 is a schematic process diagram of a semiconductor device according to an embodiment.

The process schematic diagram of FIG. 12 relates to a step of forming the second interlayer insulating film 10 on the first interlayer insulating film 9 of the member 107. The second interlayer insulating film 10 is formed on the first interlayer insulating film 9, the source electrode 4X, and the drain electrode 5X of the member 107 in which the source electrode 4X and the drain electrode 5X are formed, thereby obtaining the member 108. The second interlayer insulating film 10 is preferably a film subjected to planarization processing.

Figure 13:
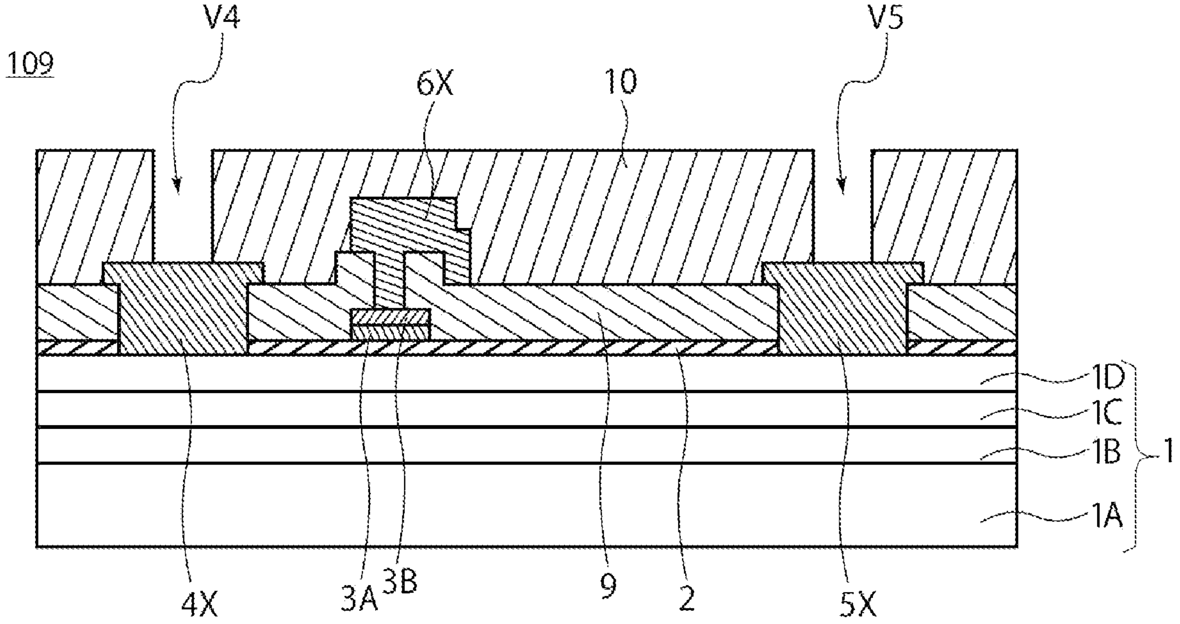
FIG. 13 is a schematic process diagram of a semiconductor device according to an embodiment.

The process schematic diagram of FIG. 13 relates to a step of forming a fourth via V4 by opening the second interlayer insulating film 10 on the source electrode 4X of the member 108 and forming a fifth via V5 by opening the second interlayer insulating film 10 on the drain electrode 5X. In this step, it is possible to obtain the member 109 in which the two vias (fourth via V4 and fifth via V5) are provided in the second interlayer insulating film 10. The fourth via V4 and the fifth via V5 are formed by, for example, etching using a mask.

Figure 14:
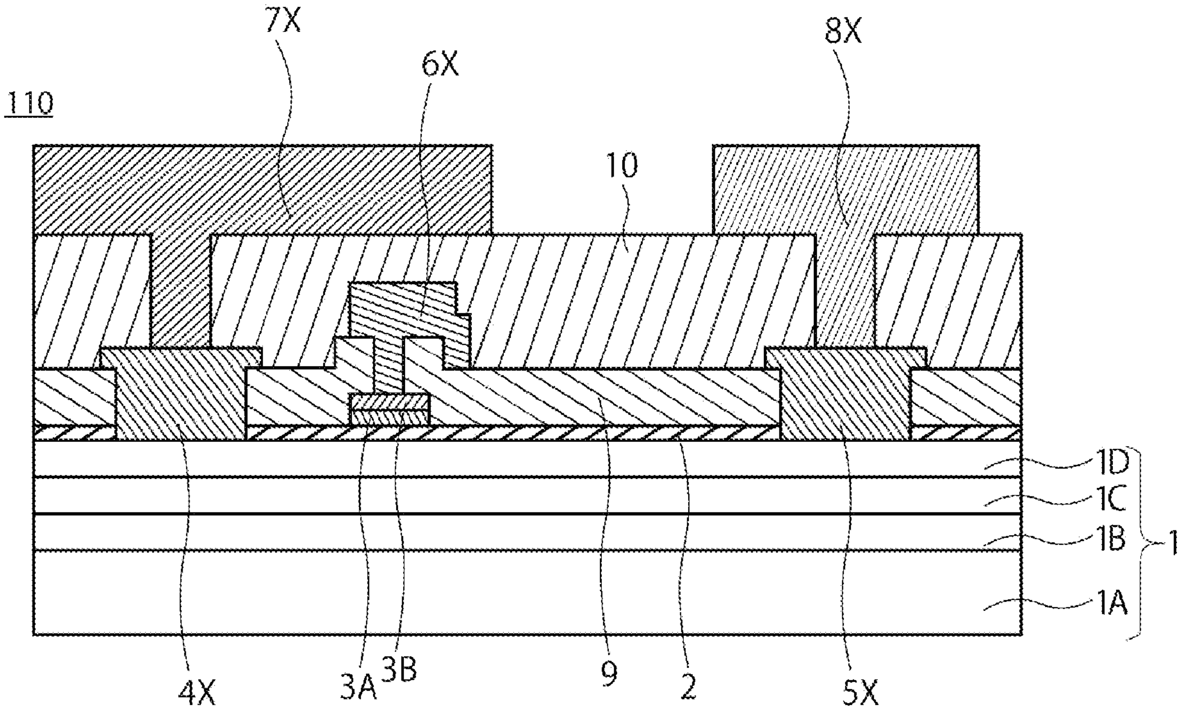
FIG. 14 is a schematic process diagram of a semiconductor device according to an embodiment.

The process schematic diagram of FIG. 14 relates to a step of forming the first source FP electrode 7 and the drain FP electrode 8 in the member 109. In the process schematic diagram of FIG. 14, the FP electrode before the heating treatment for alloying is formed. Therefore, in the process schematic diagram of FIG. 14, the precursor of the first source FP electrode 7 before alloying by the heating treatment is shown as a first source FP electrode 7X, and the precursor of the drain FP electrode 8 before alloying by the heating treatment is shown as a drain FP electrode 8X. The first source FP electrode 7X and the drain FP electrode 8X are formed in the member 109 to obtain the member 110 of FIG. 14. A metal film is formed in the member 109 and patterned to obtain the member 110 in which the first source FP electrode 7X and the drain FP electrode 8X are formed.

Consideration will be given as to a case where the second gate electrode film 3B is not present at the time of the heating treatment for alloying. When the second gate electrode film 3B is not present, consideration can be given as to a method of thickening the first gate electrode film 3A so as to prevent the first gate electrode film 3A from being penetrated when the first via V1 is formed. When the first gate electrode film 3A is formed to be thick, TiN or TiW is used for the first gate electrode film 3A, for example, and a large film stress is generated due to a stress difference between films in contact with the first gate electrode film 3A during heating. After the heating, peeling between the gate insulating film 2 and the first gate electrode film 3A is likely to occur. When peeling between the gate insulating film 2 and the first gate electrode film 3A occurs, no bias is applied, and as such, the semiconductor device 100 cannot be turned off.

Consideration will be given as to a case where the second gate electrode film 3B is not present at the time of the heating treatment for alloying. When the second gate electrode film 3B is not present, for example, consideration can be given as to a method of not thickening the first gate electrode film 3A when the first via V1 is formed. However, when the thickness of the film is increased, the resistance of the gate electrode 3 is increased. When the first gate electrode film 3A is not thickened, the first via V1 penetrates the first interlayer insulating film 9 with high reliability when the first via V1 is formed, and as such, the first gate electrode film 3A is also etched (over-etching). When the first gate electrode film 3A is deeply over-etched, the film thickness of the etched portion of the first gate electrode film 3A becomes thin. The thin first gate electrode film 3A has a reduced barrier property for metal diffusion. When the barrier property of the first gate electrode film 3A is lowered, Al or the like of the gate FP electrode 6 is diffused into the gate insulating film 2 while the first gate electrode film 3A is heated. Diffusion of Al or the like into the gate insulating film 2 causes deterioration of the gate insulating film 2. The semiconductor device having the deteriorated gate insulating film 2 has a low breakdown resistance. In addition, since the second gate electrode film 3B, which is a film configured to relax the thermal stress of the first gate electrode film 3A, is not present, the large film stress is generated due to the stress difference between the films in contact with the first gate electrode film 3A during heating. After the heating, peeling between the gate insulating film 2 and the first gate electrode film 3A is likely to occur. When peeling between the gate insulating film 2 and the first gate electrode film 3A occurs, no bias is applied, and as such, the semiconductor device 100 cannot be turned off. When the thickness of the first gate electrode film 3A is increased, the film stress increases, and the first gate electrode film 3A is easily peeled off from the gate insulating film 2.

When the second gate electrode film 3B is present at the time of the heating treatment for alloying, over-etching of the first gate electrode film 3A can be prevented or reduced. By reducing the over-etching, the barrier property of the first gate electrode film 3A can be maintained high, and deterioration due to diffusion of Al or the like from the gate FP electrode 6 to the gate insulating film 2 can be suppressed. In addition, since one of the first gate electrode film 3A and the second gate electrode film 3B has strong tensile stress and the other has strong compressive stress, thermal stress of the first gate electrode film 3A can be relaxed, and peeling between the gate insulating film 2 and the first gate electrode film 3A can be prevented.

When some elements are diffused during the heating treatment for alloying, the interface between the films may be unclear.

For example, as compared with the form in which the TiN single film without the second gate electrode film 3B is provided on the SiN film (gate insulating film 2), in the form in which the stacked film of TiN and Ti (TiN has TiN thickness of 50 [nm] and Ti thickness of 50 [nm]) is provided on the SiN film (gate insulating film 2), the film stress [GPa] in a plane direction of the film after the heating treatment is reduced by 50% or more. In addition, as compared with the form in which the TiN single film is provided on the SiN film (gate insulating film 2) without using the second gate electrode film 3B, even in the form in which the stacked film of TiN and Ti (TiN has TiN thickness of 50 [nm] and Ti thickness of [nm]) is provided on the SiN film (gate insulating film 2), the film stress [GPa] in the plane direction of the film after the heating treatment is reduced by 20% or more.

By using both the first gate electrode film 3A and the second gate electrode film 3B, it is possible to reduce two factors of decrease in reliability, that is, deterioration of the gate insulating film 2 and peeling between the gate insulating film 2 and the first gate electrode film 3A.

Figure 15:
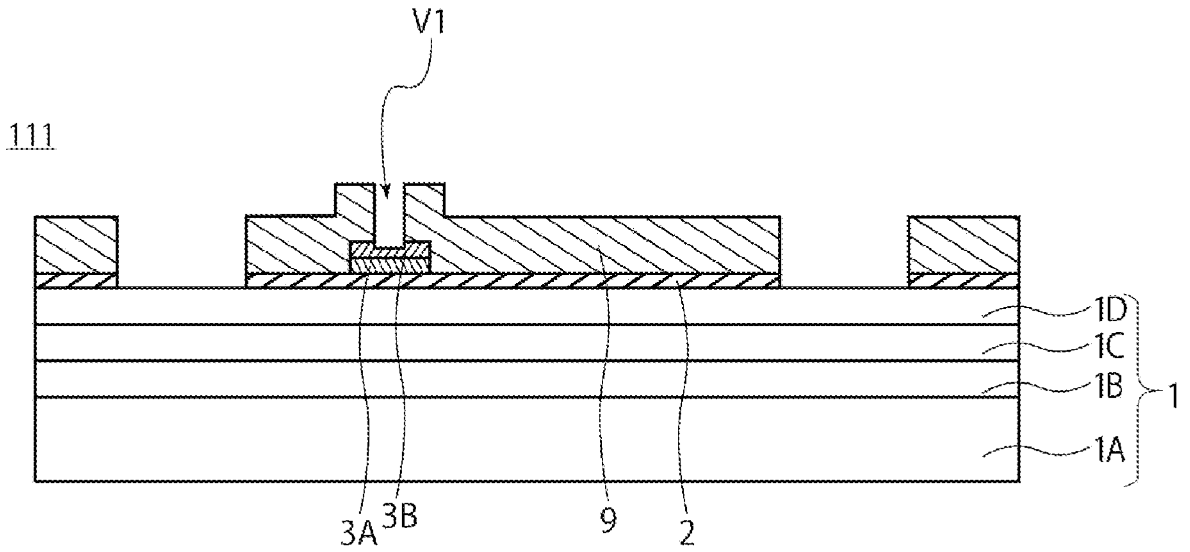
FIG. 15 is a schematic process diagram of a semiconductor device according to an embodiment.
Figure 16:
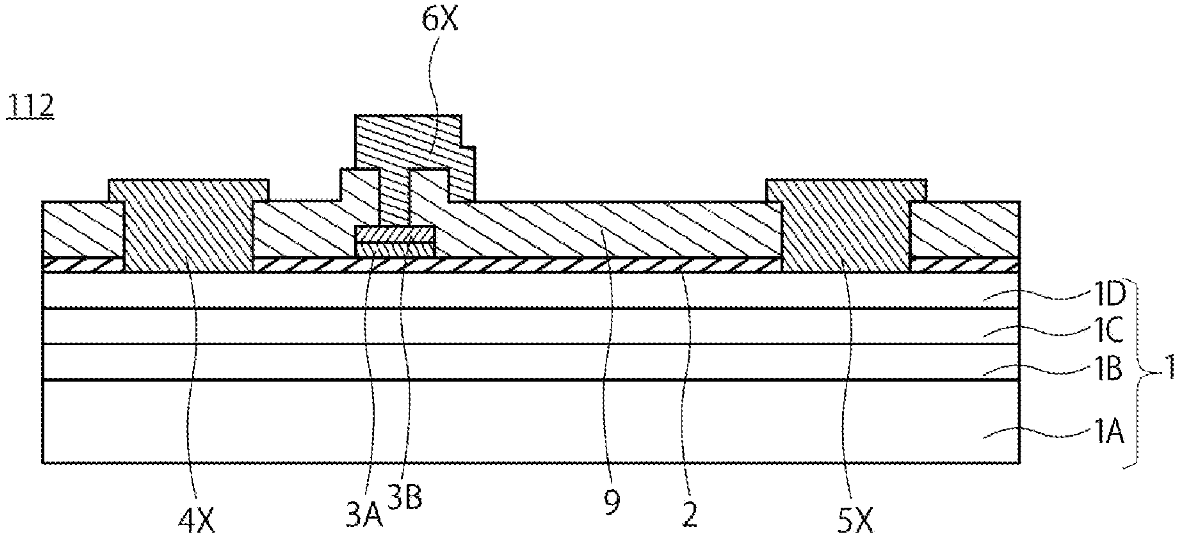
FIG. 16 is a schematic process diagram of a semiconductor device according to an embodiment.

A modification of the method of manufacturing the semiconductor device 100 will be described with reference to the process schematic diagrams of FIGS. 15 and 16. The modification of the method of manufacturing the semiconductor device 100 is different from the above-described manufacturing method in that the first via V1, the second via V2, and the third via V3 are simultaneously opened, and the gate FP electrode 6X, the first source FP electrode 7X, and the drain FP electrode 8X are simultaneously formed.

A description will be given as to the step (S04) of forming the first via V1 by opening the first interlayer insulating film 9 on the second gate electrode film 3B with reference to the process schematic diagram of FIG. 15. The first via V1, the second via V2, and the third via V3 are simultaneously opened in the member 104 to obtain a member 111 illustrated in FIG. 15. The three vias can be appropriately processed by adjusting the etching conditions, the thickness of the gate insulating film 2, the thickness of the first gate electrode film 3A, the thickness of the second gate electrode film 3B, the thickness of the first interlayer insulating film, and the like. For example, the first gate electrode film 3A is not over-etched or the thickness of the first gate electrode film 3A to be over-etched is reduced under the condition that the second via V2 and the third via V3 are processed at appropriate depths, whereby the three vias can be appropriately processed. By processing three vias by one processing, the number of steps can be greatly reduced.

A description will be given as to the step (S05) of forming the first field plate electrode (gate FP electrode) 6 in the first via V1 with reference to the process schematic diagram of FIG. 15. The gate FP electrode 6X, the source electrode 4X, and the drain electrode 5X are formed in the first via V1 of the member 111 and on the first interlayer insulating film 9 to obtain a member 112. Each electrode is processed into an electrode shape after a solid film is formed. The formation of the electrodes also contributes to reducing the number of steps by simultaneously processing a plurality of electrodes.

In the modification of the method of manufacturing the semiconductor device 100 as well, peeling between the gate insulating film 2 and the first gate electrode film 3A can be prevented, and deterioration of the gate insulating film 2 can be prevented. By adopting the stacked structure of the first gate electrode film 3A and the second gate electrode film 3B, the second via V2 of the source electrode 4 and the third via V3 of the drain electrode 5 are processed together with the gate FP electrode 6 while preventing the first gate electrode film 3A to be over-etched, thereby contributing to reduction in the number of steps.

Second Embodiment

A second embodiment relates to a semiconductor device and a method of manufacturing the semiconductor device. The semiconductor device according to the second embodiment is a modification of the semiconductor device 100 according to the first embodiment. Description of common contents between a semiconductor device 200 according to the second embodiment and the semiconductor device 100 according to the first embodiment will be omitted. In addition, the contents described in the second embodiment can be applied to the first embodiment.

Figure 17:
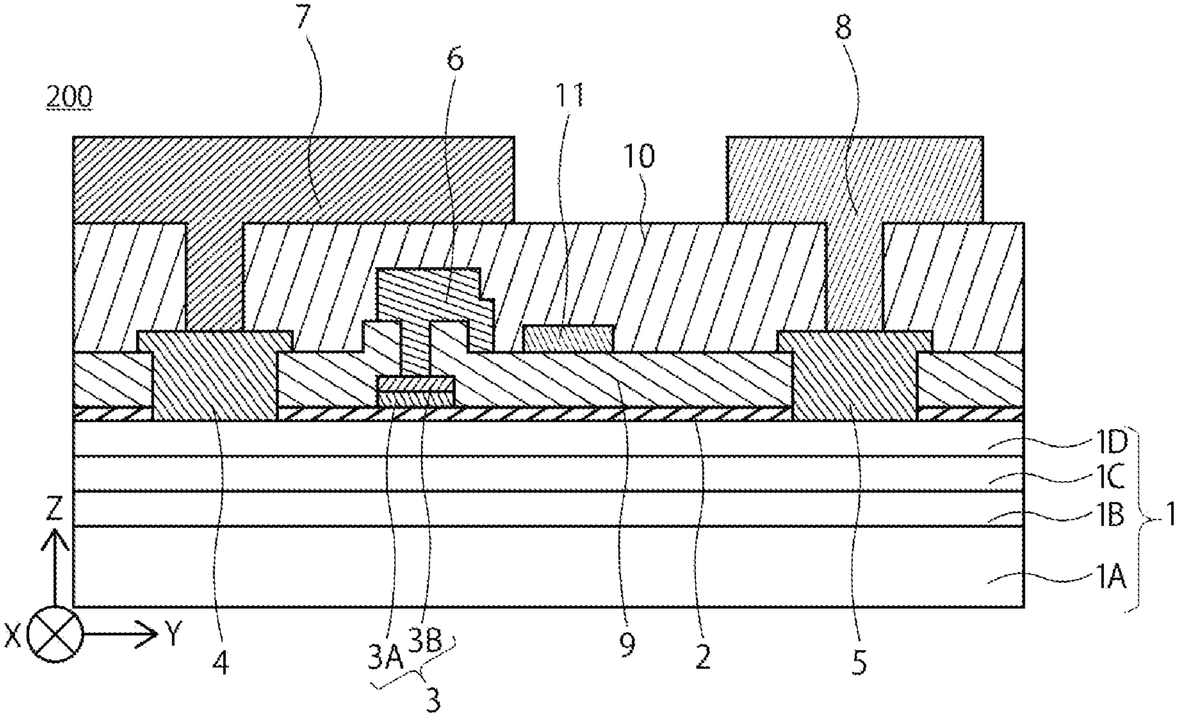
FIG. 17 is a schematic process diagram of a semiconductor device according to an embodiment.
Figure 18:
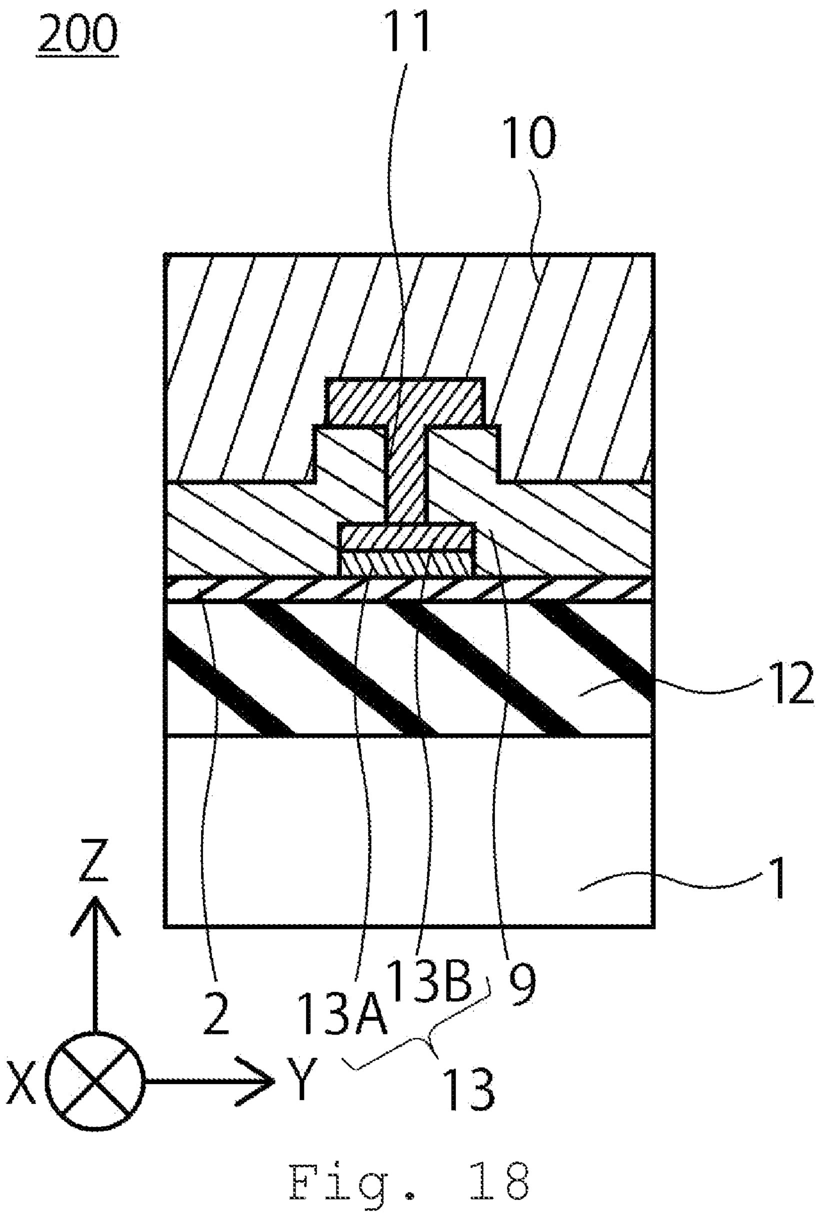
FIG. 18 is a schematic cross-sectional diagram of a semiconductor device according to an embodiment.

FIGS. 17 and 18 are schematic cross-sectional views of the semiconductor device 200 according to the second embodiment. The semiconductor device 200 includes a semiconductor layer 1, a first insulating film (gate insulating film) 2, a first electrode (gate electrode) 3, a second electrode (source electrode) 4, a third electrode (drain electrode) 5, a first field plate electrode (gate FP electrode) 6, a second field plate electrode (first source FP electrode) 7, a third field plate electrode (drain FP electrode) 8, a second insulating film (first interlayer insulating film) 9, a third insulating film (second interlayer insulating film) 10, a fourth field plate electrode (second source FP electrode) 11, and a conductive film 13. An element isolation region includes a high resistance region 12 as illustrated in the schematic diagram of FIG. 18.

FIG. 17 is a schematic diagram of the semiconductor device 200 at a position similar to that in FIG. 1. FIG. 18 is a schematic cross-sectional view of the vicinity of a fourth field plate electrode 11 located in the X direction from the cross section of FIG. 17.

The semiconductor device 200 is different from the semiconductor device 100 according to the first embodiment in that the second source FP electrode 11 and the conductive film 13 are provided.

The second source FP electrode 11 is electrically connected to the source electrode 4. The second source FP electrode 11 is provided between the gate electrode 3 and the drain electrode 5. The second source FP electrodes 11 extend in the X direction and are arranged in the Y direction similarly to the first source FP electrodes 7. The electric field concentration on the electrode can be relaxed by providing the second source FP electrode 11.

The position and shape of the second source FP electrode 11 are not particularly limited. The second source FP electrode 11 is not electrically connected to the source electrode 4 and the first source FP electrode 7, which are members electrically connected to the source electrode 4, in the element region. In the high resistance region 12 which is the element isolation region, the second source FP electrode 11 is electrically connected to the source electrode 4 and the first source FP electrode 7 via the conductive film 13.

The second source FP electrode 11 is a conductor mainly made of Al. The second source FP electrode 12 contains Al in an amount of 80 [wt %] or more, preferably 90 [wt %] or more, more preferably 95 [wt %] or more, and further more preferably 99 [wt %] or more. It is preferable that the second source FP electrode 11 is an alloy or metal silicide which contains one or more kinds selected from the group consisting of Cu, Si, and Ti in addition to Al.

The conductive film 13 is provided on the semiconductor layer 1 in the element isolation region. The conductive film 13 includes a first conductive film 13A and a second conductive film 13B. In the element isolation region, the first conductive film 13A is provided on the gate insulating film 2. In the element isolation region, the second conductive film 13B is provided on the first conductive film 13A. The first conductive film 13A is located between the semiconductor layer 1 and the second conductive film 13B. The first conductive film 13A is similar to the first gate electrode film 3A, and the second conductive film 13B is similar to the second gate electrode film 3B, except for the position where the first conductive film 13A is formed, the position where the second conductive film 13B is formed, and the fact that the first conductive film 13A and the second conductive film 13B are electrically connected to the second source FP electrode 11.

When the first conductive film 13A and the first gate electrode film 3A are formed by the same processing, elements contained in the first conductive film 13A and the first gate electrode film 3A are preferably the same.

When the second conductive film 13B and the second gate electrode film 3B are formed by the same processing, elements contained in the second conductive film 13B and the second gate electrode film 3B are preferably the same.

The minimum thickness and a maximum thickness of the first conductive film 13A are preferably 10 [nm] or more and 100 [nm] or less. When the thickness of the first conductive film 13A is large, a resistance of the gate electrode 3 increases. When the thickness of the first conductive film 13A is large, the first conductive film 13A and the gate insulating film 2 are easily peeled off. When the thickness of the first conductive film 13A is thin, the metal contained in the second source FP electrode 11 is easily diffused into the gate insulating film 2 when the second source FP electrode 11 is alloyed. That is, when the thickness of the conductive film 13A is thin, the function as a barrier metal deteriorates.

The thicknesses of the first conductive film 13A and the second gate electrode film 3B are the lengths of the first conductive film 13A and the second conductive film 13B in the stacking direction of the first conductive film 13A and the second conductive film 13B. The thickness of the first conductive film 13A can be obtained from a cross-sectional view in the same direction as the schematic cross-sectional diagram of FIG. 1.

The minimum thickness of the first conductive film 13A is the thickness of the portion where the thickness of the first conductive film 13A is the thinnest. When the second source FP electrode 11 is embedded in the first conductive film 13A, the minimum thickness of the first conductive film 13A is the thinnest portion of the portion of the first conductive film 13A where the second source FP electrode 11 is embedded and recessed.

The maximum thickness of the first conductive film 13A is the thickness of the thickest portion of the first conductive film 13A. When the second source FP electrode 11 is embedded in the first conductive film 13A, the maximum thickness of the first conductive film 13A is the thickest portion of the first conductive film 13A excluding the portion where the second source FP electrode 11 is embedded and recessed.

The minimum thickness of the first conductive film 13A is preferably 10 [nm] or more and 200 [nm] or less, and more preferably 10 [nm] or more and 100 [nm] or less.

The maximum thickness of the first conductive film 13A is preferably 10 [nm] or more and 200 [nm] or less, and more preferably 10 [nm] or more and 100 [nm] or less.

When a difference between the minimum thickness and the maximum thickness of the first conductive film 13A is large, a stress difference in the first conductive film 13A may be large. The maximum thickness of the first conductive film 13A is preferably 2.0 times or more and 1.0 times or less, and more preferably 1.5 times or more and 1.0 times or less the minimum thickness of the first conductive film 13A. When the above-described thickness relationship is satisfied, the minimum thickness of the first conductive film 13A is preferably 10 [nm] or more and 200 [nm] or less, and the maximum thickness of the first conductive film 13A is preferably 10 [nm] or more and 200 [nm] or less.

In a case where the second source FP electrode 11 is embedded in the first conductive film 13A, when the difference between the minimum thickness and the maximum thickness of the first conductive film 13A is large, the stress difference in the first conductive film 13A may increase. The maximum thickness of the first conductive film 13A is preferably 0.3 times or more and 0.9 times or less, and more preferably 0.5 times or more and 0.9 times or less the minimum thickness of the first conductive film 13A. When the above-described thickness relationship is satisfied, the minimum thickness of the first conductive film 13A is preferably 10 [nm] or more and 200 [nm] or less, and the maximum thickness of the first conductive film 13A is preferably 10 [nm] or more and 200 [nm] or less. The second conductive film 13B may be penetrated by the second source FP electrode 11 (the minimum thickness of the second conductive film 13B is 0 [nm]).

The ratio of the maximum thickness of the first conductive film 13A to the maximum thickness of the second conductive film 13B (maximum thickness of second conductive film 13B/maximum thickness of first conductive film 13A) is preferably 0.3 or more and 2.0 or less, and more preferably 0.5 or more and 1.5 or less.

The area of the first conductive film 13A (area of surface of first conductive film 13A facing second conductive film 13B) is preferably 0.5 times or more and 1.5 times or less, more preferably 0.8 times or more and 1.2 times or less the area of the second conductive film 13B (area of surface of second conductive film 13B facing first conductive film 13A).

Preferably, the second FP electrode 11 and the second conductive film 13B are in ohmic contact. The second conductive film 13B and the first conductive film 13A are preferably in ohmic contact.

A length of the plate-like portion of the second source FP electrode 11 in the second direction (Y direction) is preferably equal to or longer than a length of the first conductive film 13A in the second direction, and more preferably 1.1 times or more and 2.5 times or less the length of the first conductive film 13A in the second direction.

An end of the second source FP electrode 11 on the side of a source electrode 4 is preferably located closer to the source electrode 4 than an end of the first conductive film 13A on the side of the source electrode 4. An end of the second source FP electrode 11 on the side of a drain electrode 5 is preferably located closer to the drain electrode 5 than the end of the first conductive film 13A on the side of the drain electrode 5.

The length of the plate-like portion of the second source FP electrode 11 in the second direction (Y direction) is preferably equal to or longer than a length of the second conductive film 13B in the second direction, and more preferably 1.1 times or more and 2.5 times or less the length of the second conductive film 13B in the second direction.

The end of the second source FP electrode 11 on the side of the source electrode 4 is preferably located closer to the source electrode 4 than an end of the second conductive film 13B on the side of the source electrode 4. The end of the second source FP electrode 11 on the side of the drain electrode 5 is preferably located closer to the drain electrode 5 than the end of the second conductive film 13B on the side of the drain electrode 5.

A length of the columnar portion of the second source FP electrode 11 in the second direction (Y direction) is preferably less than the length of the first conductive film 13A in the second direction, and more preferably 0.2 times or more and 0.9 times or less the length of the first conductive film 13A in the second direction. The length of the first conductive film 13A in the second direction is preferably 150 [nm] or more longer than the length of the columnar portion of the second source FP electrode 11 in the second direction, and more preferably 150 [nm] or more and 1,000 [nm] or less longer than the length of the columnar portion of the second source FP electrode 11 in the second direction.

The length of the columnar portion of the second source FP electrode 11 in the second direction (Y direction) is preferably less than the length of the second conductive film 13B in the second direction, and more preferably 0.2 times or more and 0.9 times or less the length of the second conductive film 13B in the second direction. The length of the second conductive film 13B in the second direction is preferably 150 [nm] or more longer than the length of the columnar portion of the second source FP electrode 11 in the second direction, and more preferably 150 [nm] or more and 1,000 [nm] or less longer than the length of the columnar portion of the second source FP electrode 11 in the second direction.

When the semiconductor device 200 has a source FP electrode (not illustrated), a conductive film corresponding to the conductive film 13 is also preferably provided between the source FP electrode (not illustrated) and the gate insulating film 2. Preferably, the conductive film existing between the source FP electrode (not illustrated) and the gate insulating film 2 is electrically and directly connected to the conductive film 13 of the second source FP electrode 11, or a conductive film having a larger area than the conductive film 13 illustrated in FIG. 18 is used, and the conductive film having a larger area is connected to the second source FP electrode 11 and the source FP electrode (not illustrated).

A method of manufacturing the semiconductor device 200 according to the second embodiment will be described. The conductive film 13 is formed by patterning such that the first gate electrode film 3A and the second gate electrode film 3B of the gate electrode 3, the first conductive film 13A, and the second conductive film 13B remain in the step (S02) of forming the first gate electrode film 3A and the second gate electrode film 3B on the gate insulating film 2. Then, similarly to the first gate FP electrode 6, the second source FP electrode 11 is formed on the second conductive film 13B, and the heating treatment for alloying alloys the second source FP electrode 11 and the second conductive film 13B. The gate electrode 3 and the conductive film 13 may be separately formed in different steps.

The conductive film 13 configured to be hardly over-etched can also be provided below the second source FP electrode 11. Similarly to the gate electrode 3, the conductive film 13 also suppresses deterioration of the gate insulating film 2 and peeling between the conductive film 13 and the gate insulating film 2, thereby contributing to improvement in reliability of the semiconductor device 200.

Third Embodiment

A third embodiment relates to a semiconductor device 300 and a method of manufacturing the semiconductor device 300. The semiconductor device 300 according to the third embodiment is a modification of the semiconductor device 100 according to the first embodiment or the semiconductor device 200 according to the second embodiment. Descriptions of the common contents of the semiconductor device 100 according to the first embodiment to the semiconductor device 300 according to the third embodiment will be omitted. In addition, the contents described in the third embodiment can be applied to the first embodiment or the second embodiment.

Figure 19:
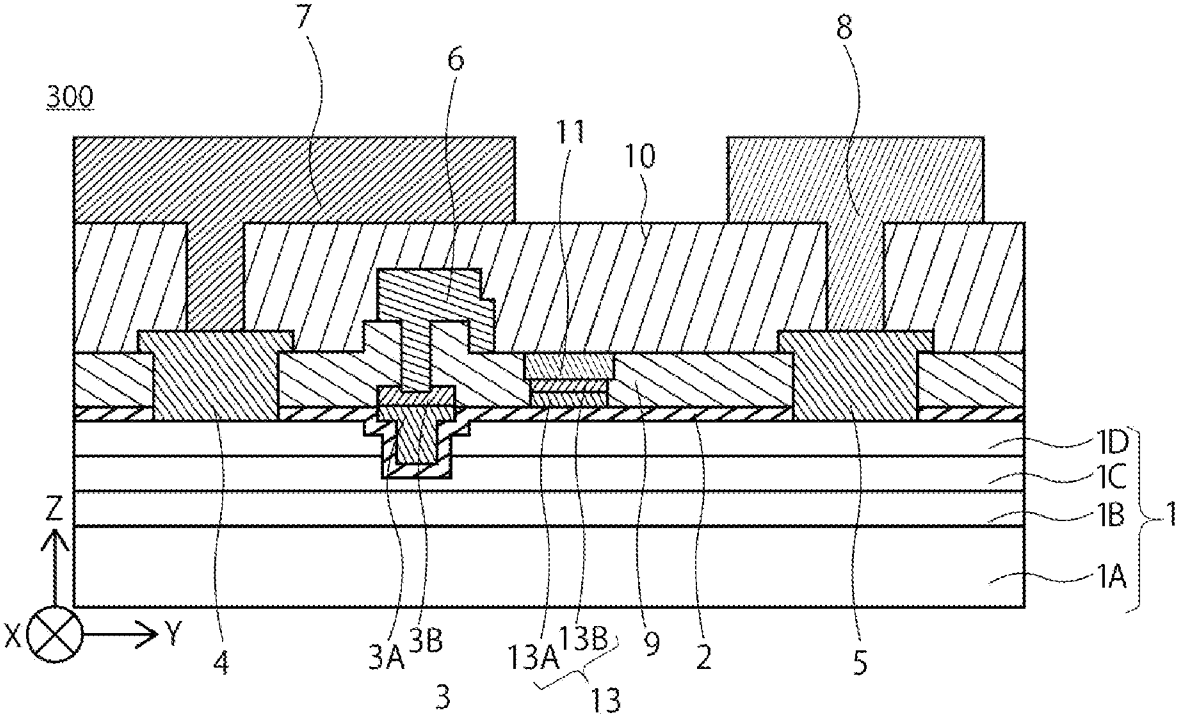
FIG. 19 is a schematic cross-sectional diagram of a semiconductor device according to an embodiment.

FIG. 19 is a schematic cross-sectional view of the semiconductor device 300 according to the third embodiment. In the semiconductor device 300 according to the third embodiment, a trench is provided in the semiconductor layer 1 below the gate electrode 3, and the gate insulating film 2 and the gate electrode 3 are provided along the trench shape. Although the first gate electrode film 3A is provided in the trench, the second gate electrode film 3B may be provided on the center side of the trench. By adopting the trench structure, the semiconductor device 300 becomes a normally-off type GaN-HEMT. The configuration of the gate electrode 3 of the embodiment can also be adopted in the normally-off type configuration.

The second source FP electrode 11 can also be formed on the gate insulating film 2 between the gate electrode 3 and the drain electrode 5. The second source FP electrode of the semiconductor device 300 does not include a columnar portion but includes a plate-like portion. The plate-like portion of the second source FP electrode 11 is in direct contact with the second conductive film 13B. When the second source FP electrode 11 is provided immediately above the gate insulating film 2, the gate insulating film 2 may deteriorate. Even when the second source FP electrode 11 is provided on the gate insulating film 2, it is preferable to use the conductive film 13 for the purpose of preventing deterioration of the gate insulating film 2.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

The accompanying claims and their equivalents are intended to cover such forms or modifications as would fall within the scope and spirit of the inventions.

What is claimed is:

1. A semiconductor device comprising:
a semiconductor layer;
a first insulating film provided on the semiconductor layer;
a first electrode film provided on the first insulating film;
a second electrode film provided on the first electrode film; and
a first field plate electrode provided on the second electrode film,
wherein a lower end of the first field plate electrode is located on a second surface of the first electrode film, the second surface being in contact with the second electrode film, rather than a first surface of the first electrode film, the first surface being in contact with the first insulating film,
the first electrode film includes at least one of M1AlN and M2AlW,
M1 is one or more kinds selected from a group consisting of Ti, W, Ta, Nb, V, and Zr,
M2 is one or more kinds selected from a group consisting of Ti, Zr, and C,
the second electrode film includes at least one of M3Al and M4AlN,
M3 is one or more kinds selected from a group consisting of Ti, Nb, V, and Zr, and
M4 is one or more kinds selected from a group consisting of Ti, W, Ta, and Zr.

2. The semiconductor device according to claim 1, wherein the semiconductor layer includes a nitride semiconductor layer.

3. The semiconductor device according to claim 1, wherein one of the first electrode film and the second electrode film has strong tensile stress, and the other has strong compressive stress.

4. The semiconductor device according to claim 1, wherein the first electrode film and the second electrode film are films having different compositions.

5. The semiconductor device according to claim 1, wherein the first field plate electrode is embedded in the second electrode film.

6. The semiconductor device according to claim 1, wherein the first field plate electrode penetrates the second electrode film.

7. The semiconductor device according to claim 1, wherein the first field plate electrode is embedded in the first electrode film.

8. The semiconductor device according to claim 1, wherein a minimum thickness of the first electrode film is 10 nanometers (nm) or more and a maximum thickness of the first electrode film is 200 nanometers (nm) or less.

9. The semiconductor device according to claim 1, further comprising:

an element isolation region;

a first conductive film on the first insulating film of the element isolation region; and a second conductive film on the first conductive film of the element isolation region, wherein an element contained in the first conductive film is the same as an element contained in the first electrode film, and an element contained in the second conductive film is the same as an element contained in the second electrode film.

10. A method of manufacturing a semiconductor device, the method comprising:

providing a first insulating film on a semiconductor layer;

forming a first electrode film and a second electrode film on the first insulating film;

forming a second insulating film on the first insulating film and the second electrode film;

forming a first via by opening the second insulating film on the second electrode film;

forming a first field plate electrode in the first via; and heating the first field plate electrode and the second electrode film to alloy the first field plate electrode and the second electrode film, wherein the first electrode film includes at least one of M1AlN and M2AlW, M1 is one or more kinds selected from a group consisting of Ti, W, Ta, Nb, V, and Zr, M2 is one or more kinds selected from a group consisting of Ti, Zr, and C, the second electrode film includes at least one of M3Al and M4AlN, M3 is one or more kinds selected from a group consisting of Ti, Nb, V, and Zr, and M4 is one or more kinds selected from a group consisting of Ti, W, Ta, and Zr.

11. The method according to claim 10, wherein the first via does not penetrate the first electrode film.

12. The method according to claim 10, wherein a minimum thickness of the first electrode film after formation of the first via is 10 nm or more and 100 nm or less.

13. The method according to claim 10, wherein a diameter of the first via is 100 nm or more and 1,000 nm or less.

14. The method according to claim 10, wherein the second electrode film before being heated contains Ti, and the first field plate electrode before being heated contains Al.

15. The method according to claim 10, wherein a maximum thickness of the first electrode film after formation of the first via is 10 nanometers (nm) or more and 100 nanometers (nm) or less.

16. The method according to claim 10, wherein a maximum thickness of the second electrode film is 10 nanometers (nm) or more and 100 nanometers (nm) or less.

17. The semiconductor device according to claim 1, wherein the first electrode film includes a region not containing Al, and the second electrode film includes a region not containing Al.

18. The semiconductor device according to claim 17, wherein the region of the first electrode which does not contain Al contains at least one of M1N and M2W, and the region of the second electrode which does not contain Al contains at least one of M3 and M4N.

* * * * *